(12) United States Patent
Atsumi et al.

(10) Patent No.: US 10,955,601 B2
(45) Date of Patent: Mar. 23, 2021

(54) OPTICAL FILM, METHOD FOR PRODUCING OPTICAL FILM, AND DISPLAY DEVICE

(71) Applicant: FUJIFILM Corporation, Tokyo (JP)

(72) Inventors: Kunihiro Atsumi, Kanagawa (JP); Yukito Saito, Kanagawa (JP); Shinichi Morishima, Kanagawa (JP); Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 93 days.

(21) Appl. No.: 16/106,677

(22) Filed: Aug. 21, 2018

(65) Prior Publication Data

US 2018/0356578 A1    Dec. 13, 2018

Related U.S. Application Data

(63) Continuation of application No. PCT/JP2017/005922, filed on Feb. 17, 2017.

(30) Foreign Application Priority Data

Feb. 22, 2016    (JP) .............................. JP2016-030706

(51) Int. Cl.
*G02B 5/30* (2006.01)
*B32B 7/02* (2019.01)
(Continued)

(52) U.S. Cl.
CPC .............. *G02B 5/3016* (2013.01); *B32B 7/02* (2013.01); *C09K 19/02* (2013.01); *C09K 19/32* (2013.01); *C09K 19/3491* (2013.01); *C09K 19/3494* (2013.01); *C09K 19/3497* (2013.01); *C09K 19/3809* (2013.01); *C09K 19/3852* (2013.01);
(Continued)

(58) Field of Classification Search
CPC ... G02B 5/3016; G02F 1/0045; G02F 1/0063; C09K 19/04–52; C09K 2019/0407–528
See application file for complete search history.

(56) References Cited

U.S. PATENT DOCUMENTS

| | | | |
|---|---|---|---|
| 7,480,021 B2 * | 1/2009 | Rao | G02B 5/3083 349/117 |
| 7,733,452 B2 * | 6/2010 | Chen | C09K 19/56 349/135 |

(Continued)

FOREIGN PATENT DOCUMENTS

| | | |
|---|---|---|
| CN | 100424568 C | 10/2008 |
| CN | 101379420 A | 3/2009 |

(Continued)

OTHER PUBLICATIONS

Office Action, issued by the Japanese Patent Office dated Jun. 11, 2019, in connection with Japanese Patent Application No. 2018-501635.

(Continued)

*Primary Examiner* — Prashant J Khatri
(74) *Attorney, Agent, or Firm* — Edwards Neils LLC; Jean C. Edwards, Esq.

(57) ABSTRACT

An optical film includes a liquid crystal layer derived from a smectic phase, wherein an Nz factor of the liquid crystal layer is from 0.2 to 0.8. A display device that includes the optical film, and a method of producing an optical film is also provided.

12 Claims, 2 Drawing Sheets

(51) Int. Cl.
*G09F 9/00* (2006.01)
*C09K 19/32* (2006.01)
*C09K 19/02* (2006.01)
*C09K 19/34* (2006.01)
*C09K 19/56* (2006.01)
*C09K 19/38* (2006.01)
*G02F 1/13363* (2006.01)
*C09K 19/54* (2006.01)
*C09K 19/04* (2006.01)
*C09K 19/20* (2006.01)
*H01L 51/52* (2006.01)
*C09K 19/30* (2006.01)
*H01L 51/00* (2006.01)
*H01L 51/56* (2006.01)

(52) U.S. Cl.
CPC ............ *C09K 19/542* (2013.01); *C09K 19/56* (2013.01); *G02B 5/30* (2013.01); *G02F 1/13363* (2013.01); *G09F 9/00* (2013.01); *C09K 2019/0448* (2013.01); *C09K 2019/2035* (2013.01); *C09K 2019/2078* (2013.01); *C09K 2019/3077* (2013.01); *C09K 2019/548* (2013.01); *C09K 2219/03* (2013.01); *G02F 2001/133638* (2013.01); *H01L 51/004* (2013.01); *H01L 51/5281* (2013.01); *H01L 51/5293* (2013.01); *H01L 51/56* (2013.01); *H01L 2251/558* (2013.01)

(56) References Cited

U.S. PATENT DOCUMENTS

| | | | |
|---|---|---|---|
| 2008/0024703 A1 | 1/2008 | Ichihashi | |
| 2009/0059370 A1* | 3/2009 | Miyazaki | G02B 5/3083 359/489.2 |
| 2009/0159857 A1* | 6/2009 | Uehira | C07D 339/06 252/585 |
| 2010/0128211 A1* | 5/2010 | Matsuda | C09K 19/3452 349/117 |
| 2011/0025952 A1 | 2/2011 | Akao et al. | |
| 2012/0249928 A1 | 10/2012 | Kaihoko et al. | |
| 2013/0229602 A1 | 9/2013 | Yoshimi | |
| 2015/0029445 A1* | 1/2015 | Takeda | G02B 5/3016 349/96 |
| 2015/0079380 A1 | 3/2015 | Muramatsu et al. | |
| 2017/0068031 A1 | 3/2017 | Yoshizawa et al. | |

FOREIGN PATENT DOCUMENTS

| | | |
|---|---|---|
| CN | 101523276 A | 9/2009 |
| CN | 101627325 A | 1/2010 |
| CN | 101946194 A | 1/2011 |
| CN | 102511017 A | 6/2012 |
| JP | 2007-536561 A | 12/2007 |
| JP | 2009-288440 A | 12/2009 |
| JP | 2011-069922 A | 4/2011 |
| JP | 2015-169875 A | 9/2015 |
| JP | 2015-200861 A | 11/2015 |
| JP | 2015-200877 A | 11/2015 |
| JP | 2015-227947 A | 12/2015 |

OTHER PUBLICATIONS

International Search Report issued in PCT/JP2017/005922 dated Jun. 13, 2017.
Written Opinion issued in PCT/JP2017/005922 dated Jun. 13, 2017.
International Preliminary Report on Patentability completed by WIPO dated Aug. 28, 2018 in connection with International Patent Application No. PCT/JP2017/005922.
Office Action, issued by the State Intellectual Property Office dated Mar. 25, 2020, in connection with Chinese Patent Application No. 201780012728.8.
Office Action, issued by the Japanese Patent Office dated Mar. 31, 2020, in connection with Japanese Patent Application No. 2018-501635.
Office Action, issued by the State Intellectual Property Office dated Oct. 9, 2020, in connection with Chinese Patent Application No. 201780012728.8.

* cited by examiner

OPTICAL FILM, METHOD FOR PRODUCING OPTICAL FILM, AND DISPLAY DEVICE

CROSS-REFERENCE TO RELATED APPLICATIONS

This application is a continuation application of International Application No. PCT/JP2017/005922, filed Feb. 17, 2017, which was published under PCT Article 21(2) in Japanese, and which claims priority from Japanese Patent Application No. 2016-030706, filed Feb. 22, 2016. The above applications are hereby expressly incorporated by reference, in their entirety, into the present application.

BACKGROUND OF THE INVENTION

1. Field of the Invention

The present invention relates to an optical film, a method for producing an optical film, and a display device.

2. Description of the Related Art

A liquid crystal display (hereinafter, also referred to as LCD) device, an organic electroluminescence (EL) display device, and the like have been widely used for mobile phones, smartphones, and the like due to low energy consumption and space saving. In such display devices, there has been a demand for improving performance such as power saving, high definition, high contrast, view angle improvement, and the like.

In order to improve a view angle, a method using an optical compensation film such as a phase difference film has been known. As a phase difference film, a $\lambda/4$ phase difference plate or a $\lambda/2$ phase difference plate is used according to properties to be compensated. In a case where monochromatic light is transmitted through a $\lambda/4$ phase difference plate or a $\lambda/2$ phase difference plate, the light is easily converted into a specific wavelength having an appropriate phase difference. However, in a case where white light obtained by mixing a plurality of monochromatic light beams is transmitted through the phase difference plate in the same manner, it is difficult to convert all light beams into specific wavelengths having an appropriate phase difference. This is because the material constituting the phase difference plate has different phase differences with respect to each monochromatic light, and generally, shorter wavelength component more easily generates a phase difference. The white light transmitted through the phase difference plate in this manner generates different phase differences with respect to the respective monochromatic light beams. A state in which different phase differences are generated according to wavelengths as described above is referred to as wavelength dispersibility or normal wavelength dispersibility.

However, since white light obtained by being transmitted through a phase difference plate has wavelength dispersibility, there is a problem that the polarization state changes at each wavelength and the polarized light converted by the phase difference plate becomes colored light. In order to solve such a problem, as a phase difference plate (broadband phase difference plate) functioning in a wide wavelength range, the material for obtaining a phase difference plate having so-called reverse wavelength dispersibility has been examined. In JP2015-200877A, an optical film exhibiting excellent reverse wavelength dispersibility and a liquid crystal compound used for the optical film are proposed.

On the other hand, there is an Nz factor as one index indicating a magnitude relationship between refractive index components nx, ny, and nz of an optical film. A film having an Nz factor of 0.5 has an almost constant phase difference value irrespective of the view angle. It is known that view angle properties are significantly improved by using such a film for a liquid crystal display device. For example, in JP2009-288440A, a phase difference film satisfying a relationship of Nz factor <1 and formed by stretching a liquid crystal layer in which homeotropic alignment is fixed is proposed.

SUMMARY OF THE INVENTION

In recent years, it has been reported that as an antireflection film for an organic EL display device, a broadband $\lambda/4$ plate formed by being combined with a phase difference plate and the like have been used to improve contrast and a change in oblique tint.

In an optical film used in a broadband phase difference plate, in a case where an Nz factor is 0.5, view angle properties are significantly improved. It is known that such a film is very useful because in a case where the film having such an Nz factor is a $\lambda/4$ plate, an ideal antireflection film for an organic EL display device is obtained and in a case where the film is a $\lambda/2$ plate, an ideal compensation film for an in-plane switching (IPS) liquid crystal display device or the like is obtained. However, an optical film having an Nz factor of 0.5 has not been realized yet.

The present invention is made in consideration of such circumstances and an object thereof is to provide an optical film capable of improving contrast and a change in oblique tint in a case where an optical film having ideal optical properties in which Nz factor is 0.5 or a value extremely close thereto is realized and is incorporated into a display device, a method for producing an optical film, and a display device provided with the optical film.

The present inventors have found that an Nz factor of 0.5 or a value extremely close thereto can be realized by subjecting a film formed by vertically aligning liquid crystal molecules in a smectic phase and fixing the alignment to fixed end uniaxial stretching, and thus have completed the present invention.

That is, an optical film of the present invention comprises a liquid crystal layer derived from a smectic phase, in which an Nz factor of the liquid crystal layer is from 0.2 to 0.8.

It is preferable that an Nz factor of the liquid crystal layer is from 0.4 to 0.7.

It is preferable that the liquid crystal layer includes a reverse wavelength dispersion liquid crystal compound.

It is preferable that retardation values Re(440), Re(550), and Re(630) of the liquid crystal layer respectively measured at a wavelength of 440 nm, a wavelength of 550 nm, and a wavelength of 630 nm satisfy the following relationships.

$$Re(440) < Re(550) \times 0.9 \text{ and } Re(630) > Re(550)$$

The optical film of the present invention may be a $\lambda/4$ plate for an organic EL display device.

The optical film of the present invention may be a $\lambda/2$ plate for an IPS liquid crystal display device.

It is preferable that a display device of the present invention comprises the optical film of the present invention.

A method for producing an optical film of the present invention comprises: a step of subjecting a smectic liquid crystal layer in which liquid crystal molecules are vertically aligned and fixed in a smectic phase to fixed end uniaxial stretching.

The optical film of the present invention has a liquid crystal layer derived from a smectic phase, and the Nz factor of the liquid crystal layer is from 0.2 to 0.8. By adopting such a constitution, in a case where the optical film is mounted on a display device such as an organic EL display device or an IPS liquid crystal display device, front surface contrast and a change in oblique tint can be improved.

According to the method for producing an optical film of the present invention, it is possible to obtain an optical film having an Nz factor of 0.5.

According to the display device according to the present invention, it is possible to increase contrast and reduce a change in oblique tint.

Figure 2:
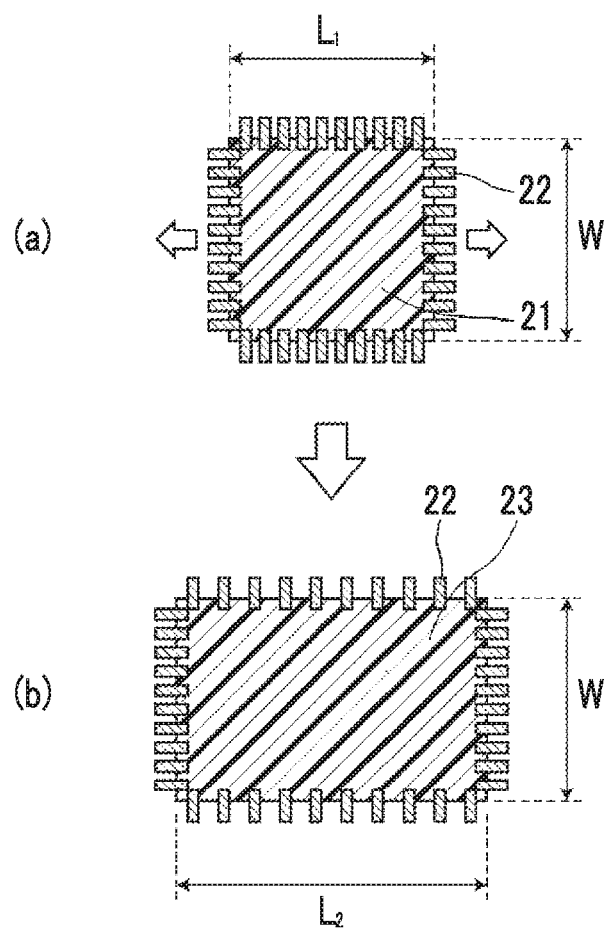

(a) and (b) of FIG. 2 are schematic views showing a method for producing an optical film of the present invention.

Figure 3:
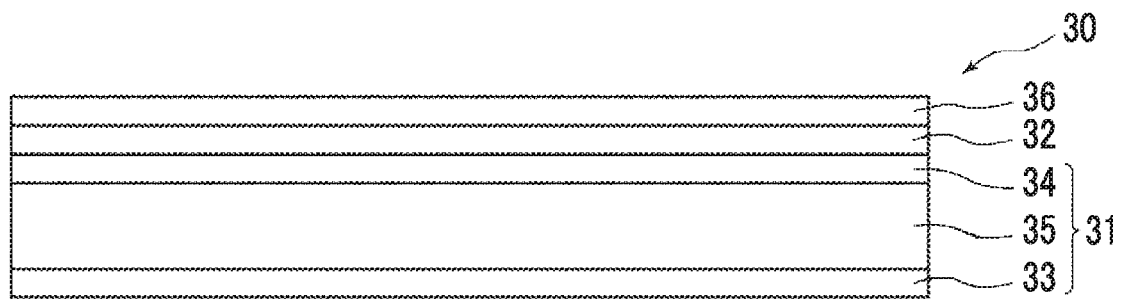

FIG. 3 is a schematic cross-sectional view showing an organic EL display device of the present invention.

Figure 4:
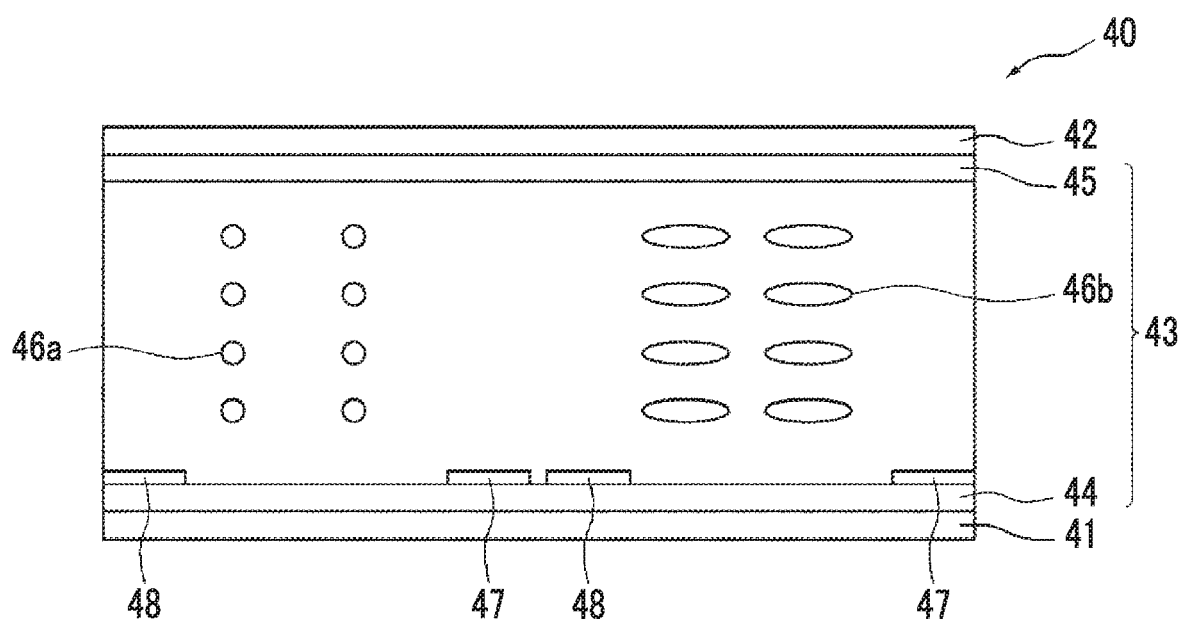

FIG. 4 is a schematic cross-sectional view showing an IPS liquid crystal display device of the present invention.

DESCRIPTION OF THE PREFERRED EMBODIMENTS

Hereinafter, the present invention will be described in detail. The following description of the constitutional requirements is made based on representative embodiments of the present invention, but it should not be construed that the present invention is limited to those embodiments. In the present specification, numerical value ranges expressed by "to" mean that the numerical values described before and after "to" are included as a lower limit and an upper limit, respectively. In addition, it is defined that the terms "orthogonal" and "parallel" with respect to an angle mean a range expressed by precise angle ±10°, and the terms In the present specification, the term "reverse wavelength dispersibility" means a property that the absolute value of in-plane retardation increases as the wavelength becomes longer.

In the present specification, Re(λ) and Rth(λ) represent an in-plane retardation and a thickness direction retardation at a wavelength λ, respectively. Re(λ) represents a value measured by making light having a wavelength of λ nm to be incident onto a film in a direction normal to the film using "WR" (product name, manufactured by Oji Scientific Instruments).

In a case where a film to be measured is one expressed by a uniaxial or biaxial index ellipsoid, Rth(λ) is calculated in the following manner.

Rth(λ) is measured by the following method. Re(λ) is measured at six points in total by making light having a wavelength of λ nm to be incident onto a film in respective directions tilted from a direction normal to the film with an in-plane slow axis (which is determined with "WR") as a tilt axis (rotation axis) (in a case where there is no slow axis, an arbitrary direction in the film plane serves as a rotation axis) up to 50 degrees on one side of the film in the normal direction with a step of 10 degrees, and Rth is calculated with "WR" based on the retardation values thus measured, the assumed value of the average refractive index, and the input film thickness value.

In the above description, in a case of a film that has a direction in which the retardation value thereof is zero at a certain tilt angle relative to the in-plane slow axis thereof in the normal direction taken as a rotation axis, the retardation value at a tilt angle larger than the tilt angle is converted into the corresponding negative value and then calculated by "WR".

Additionally, with the slow axis taken as the tilt axis (rotation axis) (in the case in which the film does not have a slow axis, an arbitrary in-plane direction of the film may be taken as the rotation axis), the retardation values are measured in two arbitrary tilted directions and, based on the above values, the assumed value of the average refractive index, and the inputted film thickness value, Rth can be also calculated according to Equations (1) and (2).

$$Re(\theta) = \left[ nx - \frac{ny \times nz}{\sqrt{\left\{ ny \, \sin\left(\sin^{-1}\left(\frac{\sin(-\theta)}{nx}\right)\right)\right\}^2 + \left\{ nz \, \cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}} \quad \text{Equation (1)}$$

$$Rth = \left[\frac{nx + ny}{2} - nz\right] \times d \quad \text{Equation (2)}$$

"equal" and "different" with respect to an angle can be determined based on a criterion that whether the difference is less than 5° or not.

In the present specification, the term "slow axis" means a direction in which the refractive index becomes the maximum in the film plane, and the term "polarizing plate" is used in a sense of including both a long polarizing plate and a polarizing plate cut in a size to be incorporated in a display device unless otherwise specified. Herein, the term "cutting" includes "punching", "cutting out", and the like. In the present specification, among "polarizing plates", particularly, an aspect including a laminate of an optical film of the present invention or a general λ/4 plate and a polarizing film is called "antireflection plate" or "circular polarizing plate".

In the equations, Re(θ) represents a retardation value in a direction tilted by an angle θ from a normal direction. nx represents a refractive index in an in-plane slow axis direction, ny represents a refractive index in a direction orthogonal to nx in the plane, and nz represents a refractive index in a direction orthogonal to nx and ny. d represents a film thickness.

In the case in which the film to be measured cannot be expressed by a uniaxial or biaxial index ellipsoid, that is, the film that does not have a so-called optic axis, Rth(λ) is calculated in the following manner.

Rth(λ) is measured by the following method. Re(λ) is measured at eleven points by making light having a wavelength of λ nm to be incident onto the film in respective tilt directions of from −50 degrees to +50 degrees with a step of 10 degrees with respect to the direction normal to the film with the in-plane slow axis (which is determined with "WR") taken as a tilt axis (rotation axis), and Rth is calculated with "WR" based on the retardation values thus measured, the assumed value of the average refractive index, and the input film thickness value.

In the above measurements, the assumed value of the average refractive index may be the values shown in Polymer Handbook (JOHN WILEY & SONS, INC) and the brochures of various optical films. For the film with an unknown average refractive index value, the film may be measured for the average refractive index with an Abbe refractometer. Examples of the average refractive index values of the major optical films are shown below; cellulose acylate (1.48), cycloolefin polymer (1.52), polycarbonate (1.59), polymethyl methacrylate (1.49), and polystyrene (1.59). By inputting the assumed value of the average refractive index and the film thickness, the values of nx, ny and nz are calculated with "WR". The Equation of Nz factor=(nx−nz)/(nx−ny) is calculated based on the calculated values of nx, ny and nz.

<<Optical Film>>

In the present specification, the term "optical film" means a film that can be used as an optical member for various optical elements of various display devices, light emitting devices, polarizing plates, and the like.

An optical film of the present invention has a liquid crystal layer derived from a smectic phase and an Nz factor of the liquid crystal layer is from 0.2 to 0.8. Here, in a case where the liquid crystal layer derived from a smectic phase is provided on a support, the wavelength dispersion of the support, and the effect of Re(λ) or Rth(λ) is ignorable, the optical properties of the optical film may be measured as it is. In a case where a support affected by the optical properties of the liquid crystal layer derived from a smectic phase is used, the liquid crystal layer derived from a smectic phase is peeled off and then the optical properties of the liquid crystal layer is measured.

The Nz factor is a value calculated by Equation Nz factor=(nx−nz)/(nx−ny), or a value calculated by Nz factor=Rth(550)/Re(550)+0.5.

The Nz factor is preferably from 0.4 to 0.7.

In the present specification, the term "smectic phase" refers to a state in which liquid crystal molecules are aligned in on direction and have a layer structure. The term "nematic phase" refers to a state in which constituent molecules thereof have an alignment order or do not have a three-dimensional positional order.

The smectic phase has a structure formed by laminating a plurality of layers in which liquid crystal molecules are vertically aligned. A smectic liquid crystal layer is subjected to fixed end uniaxial stretching by a production method of the present invention, which will be described later, liquid crystal molecules that are vertically aligned in the layer fall in the extension direction but the layer order is maintained. The expression "liquid crystal layer derived from the smectic phase" means a liquid crystal layer in which the vertically aligned liquid crystal molecules are disturbed but the layer order is maintained. In a state in which the layer order of the smectic phase is maintained, whether or not the liquid crystal compound is fixed can be confirmed by performing observation of an X-ray diffraction pattern. In a case where the liquid crystal molecules are fixed in a smectic phase state, the X-ray diffraction pattern derived from the layer order is observed and thus the fixed state can be determined.

It is preferable that the optical film has a film thickness of 60 μm or less from the viewpoint of thinning of the member. From the viewpoint of production suitability, the film thickness is preferably 5 μm or more. In a case of using a λ/4 plate or a λ/2 plate, the film thickness is appropriately set according to the purpose.

(Liquid Crystal Layer Derived from Smectic Phase)

The liquid crystal layer derived from the smectic phase may exhibit any of a reverse wavelength dispersibility, flat wavelength dispersibility, and normal wavelength dispersibility.

The film thickness of the liquid crystal layer derived from the smectic phase is preferably 2 to 30 μm, more preferably 3 to 20 μm, and even more preferably 5 to 15 μm.

In addition, in a case of a λ/4 plate, the Re of the liquid crystal layer derived from the smectic phase preferably satisfies 120 nm≤Re(550)≤150 nm and more preferably satisfies 130 nm≤Re(550)≤140 nm. In a case of a λ/2 plate, the Re of the liquid crystal layer preferably satisfies 200 nm≤Re(550)≤320 nm and more preferably satisfies 230 nm≤Re(550)≤300 nm.

In a case of a λ/4 plate, the Rth of the liquid crystal layer derived from the smectic phase preferably satisfies −45 nm≤Rth(550)≤45 nm and more preferably satisfies −25 nm≤Rth(550)≤25 nm. In a case of a λ/2 plate, the Rth of the liquid crystal layer preferably satisfies −100 nm≤ Rth(550)≤100 nm and more preferably satisfies −50 nm≤Rth (550)≤50 nm. Within these ranges, the Nz factor can be set to be from 0.2 to 0.8 and in a case where the optical film is incorporated into a display device, the effect of the present invention can be more effectively exhibited.

The liquid crystal layer derived from the smectic phase may include a reverse wavelength dispersion liquid crystal compound or may be entirely formed of a reverse wavelength dispersion liquid crystal compound.

It is preferable that the retardation values Re(440), Re(550), and Re(630) of the liquid crystal layer derived from the smectic phase as respectively measured at a wavelength of 440 nm, a wavelength of 550 nm, and a wavelength of 630 nm satisfy the following relationships.

$$Re(440)<Re(550)\times 0.9 \text{ and } Re(630)>Re(550)$$

The liquid crystal layer derived from the smectic phase may be formed of a single layer or a plurality of layers. However, from the viewpoint that the step can be shortened, optical defects are not easily caused due to a simple constitution as compared with one of the related art, and the like, the liquid crystal layer is preferably formed of a single layer.

Since the Nz factor of the liquid crystal layer of the optical film of the present invention is from 0.2 to 0.8, the optical film is useful as a λ/4 plate for an organic EL display device or a λ/2 plate for an IPS liquid crystal display device.

Figure 1:
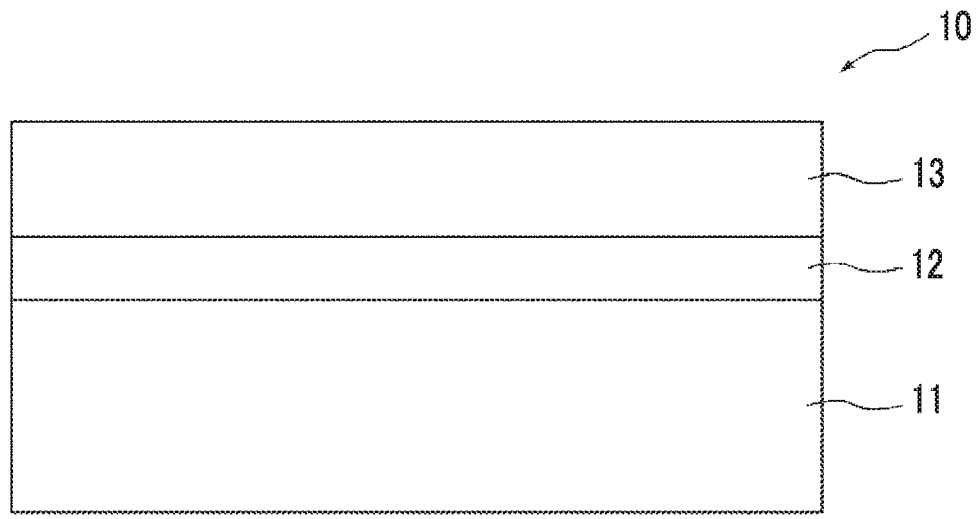
FIG. 1 is a schematic cross-sectional view showing an embodiment of an optical film of the present invention.

FIG. 1 shows a schematic cross-sectional view showing an embodiment of the optical film of the present invention. As shown in FIG. 1, an optical film 10 of the embodiment has an alignment layer 12, and a liquid crystal layer 13 derived from a smectic phase on a support 11. The optical film 10 may include functional layers, such as an adhesive layer and a support, other than the liquid crystal layer derived from the smectic phase.

<<Method for Producing Optical Film>>

A method for producing an optical film of the present invention will be described. (a) and (b) of FIG. 2 show schematic views showing a method for producing an optical film of the present invention. The method for producing an optical film of the present invention includes a step of subjecting a smectic liquid crystal layer in which liquid crystal molecules are vertically aligned and fixed in a smectic phase to fixed end uniaxial stretching.

As shown in (a) of FIG. 2, the periphery of a film 21 in which the smectic liquid crystal layer is formed is fixed with a tenter 22 and stretched in the right and left direction of the plane of paper (the arrows in the drawing) (fixed end uniaxial stretching) not to change a width W. In a case where the film is uniaxially stretched in this manner, as shown in (b) of FIG. 2, the width W is not changed and a length $L_1$ is extended to $L_2$.

Although there may be a case where the vertical alignment direction of the liquid crystal molecules has a tilt angle different from the tilt angle before stretching with respect to the layer plane by performing the fixed end uniaxial stretching, the layer order of the smectic liquid crystal layer is maintained. This is layer is the liquid crystal layer derived from the smectic phase.

The stretching ratio is appropriately adjusted such that the Nz factor is from 0.2 to 0.8. In order to make the Nz factor greater than 0.2 and equal to or less than 0.8, the stretching ratio is preferably 30% to 70% and more preferably 40% to 60%.

A stretching device is not particularly limited as long as fixed end uniaxial stretching can be performed. In addition to a batch type stretching machine shown in (a) and (b) of FIG. 2, a tenter type stretching machine which performs stretching in a width direction while performing roll conveying in a longitudinal direction, a roll stretching machine which performs stretching in a longitudinal direction while suppressing width shrinkage by setting the interval between rolls to be narrow, and the like can be used.

<Composition for Smectic Liquid Crystal Layer>

Hereinafter, the details of a composition for forming a smectic liquid crystal layer will be described.

In the present specification, the term "smectic liquid crystal layer" means a liquid crystal layer after the composition is applied and cured and before the layer is stretched. The composition for a smectic liquid crystal layer includes a liquid crystal compound, and preferably further includes a polymerization initiator, a solvent, or a vertical alignment agent, if necessary.

(Liquid Crystal Compound)

The liquid crystal compound used for the smectic liquid crystal layer is preferably a rod-like liquid crystal compound. Specific rod-like liquid crystal compounds will be described later. The amount of the liquid crystal compound contained is preferably from 50% by mass to 98% by mass with respect to the total mass of the composition. In addition, it is more preferable that the liquid crystal compound is polymerizable. The amount of polymerizable liquid crystal compound contained is preferably 50% by mass or more, or 100% by mass, with respect to the total mass of the liquid crystal compound.

As the liquid crystal compound, any of known liquid crystal compounds may be used, and for example, the compounds represented by Formula (I) described in JP2008-297210A (particularly, the compounds described in paragraphs 0034 to 0039), the compounds represented by Formula (I) described in JP2010-84032A (particularly, the compounds described in paragraphs 0067 to 0073), and the like may be used. Further, particularly, in combination with other liquid crystal compounds, a rod-like liquid crystal compound selected from azomethines, azoxies, cyanobiphenyls, cyanophenyl esters, benzoic esters, cyclohexanecarbonic phenyl esters, cyanophenylcyclohexanes, cyano-substituted phenylpyrimidines, alkoxy-substituted phenylpyrimidines, phenyl dioxanes, tolanes, and alkenylcyclohexylbenzonitrile may be used.

As an example of a particularly preferable rod-like liquid crystal compound, a compound represented by Formula (II).

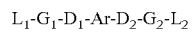

$L_1$-$G_1$-$D_1$-Ar-$D_2$-$G_2$-$L_2$   Formula (II)

In the above formula, $D_1$ and $D_2$ each independently represent —CO—O—, —O—CO—, —C(=S)O—, —O—C(=S)—, —CR$^1$R$^2$—, —CR$^1$R$^2$—CR$^3$R$^4$—, —O—CR$^1$R$^2$—, —CR$^1$R$^2$—O—, —CR$^1$R$^2$—O—CR$^3$R$^4$—, —CR$^1$R$^2$—O—CO—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, —CR$^1$R$^2$—NR$^3$—, —CO—NR$^1$—, or —NR$^1$—CO—, and R$^1$, R$^2$, R$^3$, and R$^4$ each independently represent a hydrogen atom, a halogen atom, or an alkyl group having 1 to 4 carbon atoms. $G_1$ and $G_2$ each independently represent a divalent alicyclic hydrocarbon group having 5 to 8 carbon atoms, and the methylene group contained in the alicyclic hydrocarbon group may be substituted by —O—, —S—, or —N(R$^6$)— where R$^6$ represents a hydrogen atom or an alkyl group having 1 to 6 carbon atoms. $L_1$ and $L_2$ each independently represent a monovalent organic group, and at least one selected from the group consisting of $L_1$ and $L_2$ represents a monovalent group having a polymerizable group. Ar represents a divalent aromatic ring group represented by Formula (II-1), (II-2), (II-3), or (II-4).

Formulae

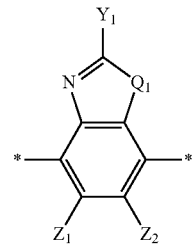

(II-1)

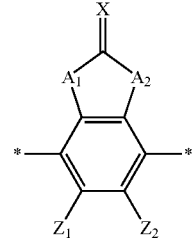

(II-2)

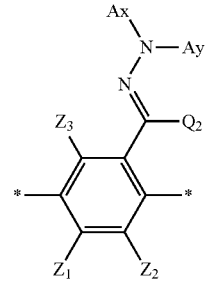

(II-3)

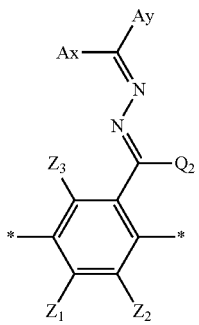

(II-4)

In Formulae (II-1) to (II-4), $Q_1$ represents —S—, —O—, or $NR^{11}$— where $R^{11}$ represents a hydrogen atom or an alkyl group having 1 to 6 carbon atoms. $Y_1$ represents an aromatic hydrocarbon group having 6 to 12 carbon atoms or an aromatic heterocyclic group having 3 to 12 carbon atoms. $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, $-NR^{12}R^{13}$, or $SR^{12}$. $Z_1$ and $Z_2$ may be bonded to each other to form an aromatic ring or an aromatic heterocyclic ring, and $R^{12}$ and $R^{13}$ each independently represent a hydrogen atom or an alkyl group having 1 to 6 carbon atoms. $A_1$ and $A_2$ each independently represent a group selected from the group consisting of —O—, $-NR^{21}$— (where $R^{21}$ represents a hydrogen atom or a substituent), —S—, and —CO—. X represents a non-metal atom of Groups XIV to XVI to which a hydrogen atom or a substituent may be bonded. Ax represents an organic group having 2 to 30 carbon atoms and having at least one aromatic ring selected from the group consisting of an aromatic hydrocarbon ring and an aromatic heterocyclic ring. Ay represents a hydrogen atom, an alkyl group having 1 to 6 carbon atoms which may have a substituent, or an organic group having 2 to 30 carbon atoms and having at least one aromatic ring selected from the group consisting of an aromatic hydrocarbon ring and an aromatic heterocyclic ring. The aromatic ring contained in Ax and Ay may have a substituent, and Ax and Ay may be bonded to each other to form a ring. $Q_2$ represents a hydrogen atom or an alkyl group having 1 to 6 carbon atoms which may have a substituent.

As for definitions and preferred ranges of the individual substituents of the compound represented by Formula (II), $D_1$, $D_2$, $G_1$, $G_2$, $L_1$, $L_2$, $R^1$, $R^2$, $R^3$, $R^4$, $Q_1$, $Y_1$, $Z_1$, and $Z_2$ can be referred respectively to the description on $D^1$, $D^2$, $G^1$, $G^2$, $L^1$, $L^2$, $R^1$, $R^2$, $R^3$, $R^4$, $X^1$, $Y^1$, $Q^1$, and $Q^2$ of Compound (A) in JP2012-21068A, $A_1$, $A_2$, and X can be referred to the description on $A_1$, $A_2$, and X of the compound represented by Formula (I) in JP2008-107767A, and Ax, Ay, and $Q^2$ can be referred to the description on Ax, Ay, and $Q^1$ of the compound represented by Formula (I) in WO2013/018526A. $Z_3$ may be referred to the description on $Q^1$ of Compound (A) in JP2012-21068A.

Particularly, the organic group represented by each of $L_1$ and $L_2$ is preferably a group represented by -$D_3$-$G_3$-Sp-$P_3$. $D_3$ has the same definition as $D_1$. $G_3$ represents a single bond, a divalent aromatic ring group or heterocyclic group having 6 to 12 carbon atoms, or a divalent alicyclic hydrocarbon group having 5 to 8 carbon atoms, and the methylene group contained in the alicyclic hydrocarbon group may be substituted by —O—, —S—, $-NR^7$— where $R^7$ represents a hydrogen atom or an alkyl group having 1 to 6 carbon atoms. Sp represents a single bond, or a spacer group represented by $-(CH_2)_n-$, $-(CH_2)_n-O-$, $-(CH_2-O-)_n-$, $-(CH_2CH_2-O-)_m-$, $-O-(CH_2)_n-$, $-O-(CH_2)_n-O-$, $-O-(CH_2-O-)_n-$, $-O-(CH_2CH_2-O-)_m-$, $-C(=O)-O-(CH_2)_n-$, $-C(=O)-O-(CH_2)_n-O-$, $-C(=O)-O-(CH_2-O-)_n-$, $-C(=O)-O-(CH_2CH_2-O-)_m-$, $-C(=O)-N(R^8)-(CH_2)_m-$, $-C(=O)-N(R^8)-(CH_2)_n-O-$, $-C(=O)-N(R^8)-(CH_2-O-)_n-$, or $-C(=O)-N(R^8)-(CH_2CH_2-O-)_m-$. Here, n represents an integer of 2 to 12, m represents an integer of 2 to 6, and $R^8$ represents a hydrogen atom or an alkyl group having 1 to 6 carbon atoms. $P_3$ represents a polymerizable group.

The polymerizable group is not particularly limited, but it is preferably a polymerizable group capable of radical polymerization or cationic polymerization. A generally known radically polymerizable group can be used as the radically polymerizable group, and suitable examples thereof include an acryloyl group and a methacryloyl group. In this case, it is generally known that an acryloyl group exhibits a fast polymerization rate, and an acryloyl group is preferable from the viewpoint of productivity improvement, but a methacryloyl group can also be used as a polymerizable group of a highly birefringent liquid crystal. A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is particularly preferable.

Examples of particularly preferable polymerizable groups include the following.

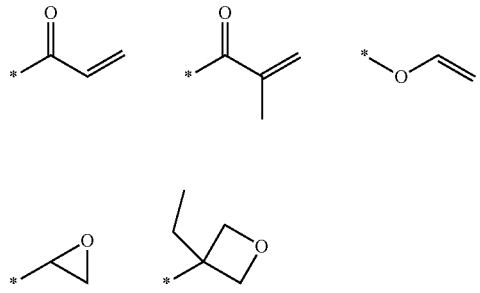

In the present specification, the "alkyl group" may be may be linear, branched or cyclic. Examples thereof include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a 1,1-dimethyl propyl group, an n-hexyl group, an isohexyl group, a cyclopropyl group, a cyclobutyl group, a cyclopentyl group, and a cyclohexyl group.

Preferable examples of the compound represented by Formula (II) are shown below but the compound is not limited thereto.

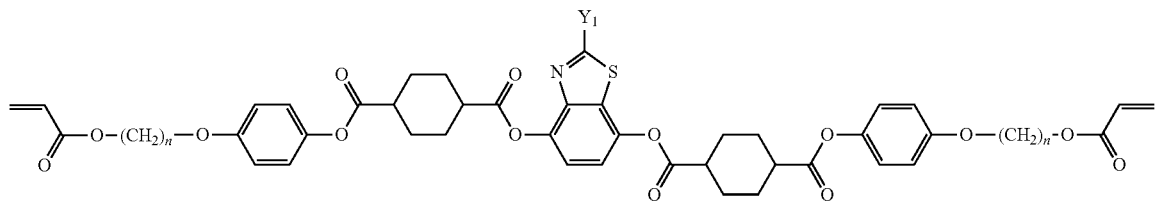
| No | Y1 | n |
|---|---|---|
| II-1-1 | phenyl (*) | 6 |
| II-1-2 | 4-CN-phenyl (*) | 6 |
| II-1-3 | 4-NO₂-phenyl (*) | 6 |
| II-1-4 | 4-pyridyl (*) | 6 |
| II-1-5 | 4-(styryl)phenyl (*) | 6 |
| II-1-6 | 4-NO₂-phenyl (*) | 11 |
-continued
| No | Y1 | n |
|---|---|---|
| II-1-7 | 4-NO₂-phenyl (*) | 8 |
| II-1-8 | 4-NO₂-phenyl (*) | 4 |
| II-1-9 | 2-thienyl (*) | 6 |
| II-1-10 | 2-methyl-3-nitrophenyl (*) | 6 |
| II-1-11 | 4,6-dimethylbenzofuran-2-yl (*) | 6 |
| II-1-12 | 2-furyl (*) | 6 |
| II-1-13 | 5-chloro-2-thienyl (*) | 6 |

-continued
| No | Y1 | n |
|---|---|---|
| II-1-14 | thiazol-5-yl | 6 |
| II-1-15 | 4-(methylsulfonyl)phenyl | 6 |
| No | X | R1 |
|---|---|---|
| II-2-1 | NC-CH2-CN | H |
| II-2-2 | NC-CH2-C(O)OCH3 | H |
| II-2-3 | NC-CH2-C(O)O-butyl | H |
II-1-16
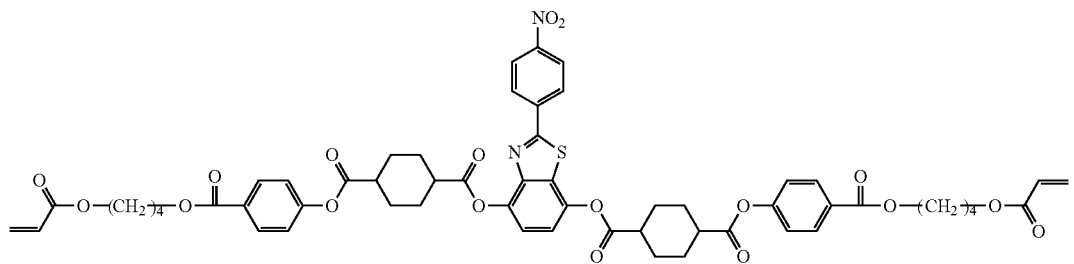
II-1-17
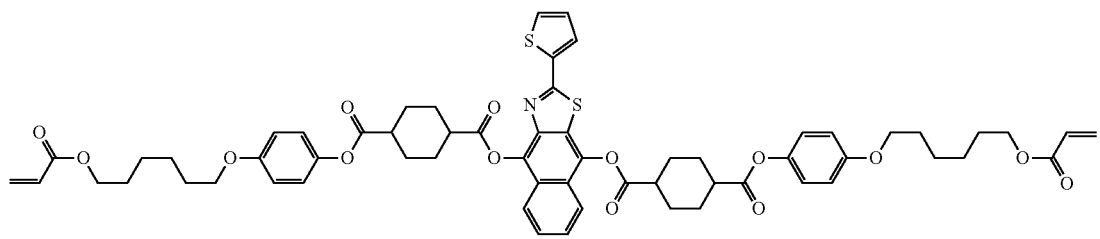
II-1-18
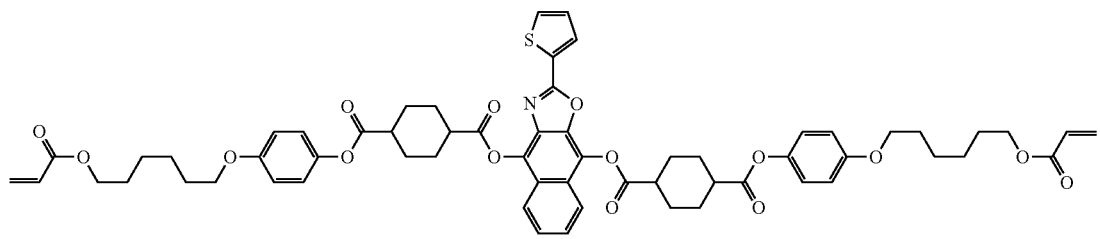
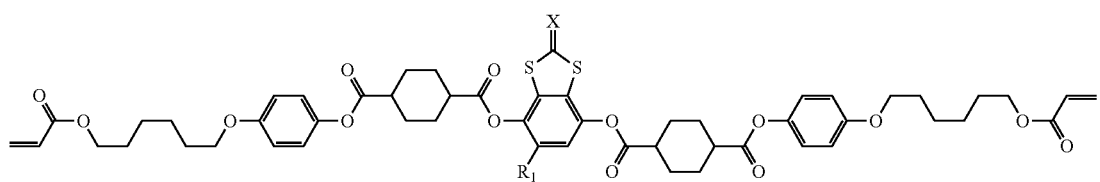

-continued
| No | X | R1 |
|---|---|---|
| II-2-4 | NC-C(=O)-O-CH2CH2-O-C(CH3)2-OH | H |
| II-2-5 | NC-CH2-CN | CH3 |
-continued
| No | X | R1 |
|---|---|---|
| II-2-6 | NC-CH2-CN | C(CH3)3 (tert-butyl) |
| II-2-7 | S | H |
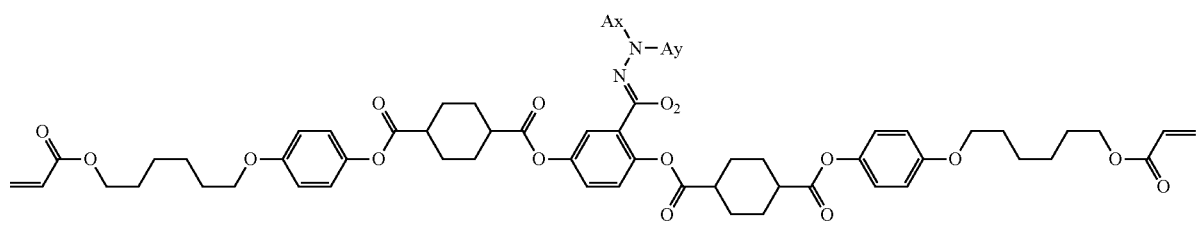
| No | Ax | Ay | Q2 |
|---|---|---|---|
| II-3-1 | benzothiazol-2-yl | H | H |
| II-3-2 | benzoxazol-2-yl | H | H |
| II-3-3 | naphthalen-1-yl | H | H |
| II-3-4 | Ph | Ph | H |
| II-3-5 | quinolin-2-yl | H | H |
| II-3-6 | phthalazin-1-yl | H | H |
| II-3-7 | benzothiazol-2-yl | CH3 | H |
| II-3-8 | benzothiazol-2-yl | C4H9 | H |

-continued
| No | Ax | Ay | Q2 |
|---|---|---|---|
| II-3-9 | 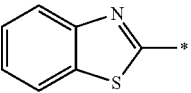 | C$_6$H$_{13}$ | H |
| II-3-10 | 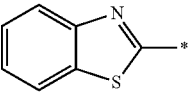 | 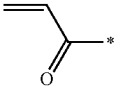 | H |
| II-3-11 | 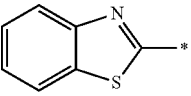 | 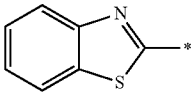 | H |
| II-3-12 | 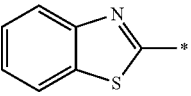 | CH$_2$CN | H |
| II-3-13 | 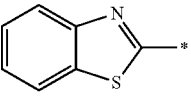 | 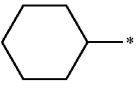 | H |
| II-3-14 | 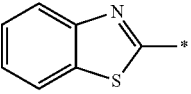 | 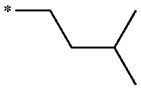 | H |
| II-3-15 | 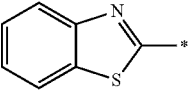 | CH$_3$CH$_2$OH | H |
| II-3-16 | 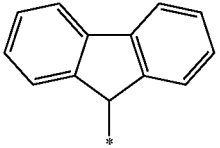 | H | H |
| II-3-17 | 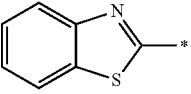 | CH$_2$CF$_3$ | H |
| II-3-18 | 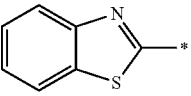 | H | CH$_3$ |
| II-3-19 | 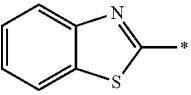 | 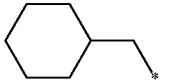 | H |
| II-3-20 | 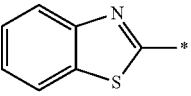 | 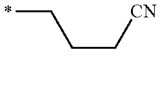 | H |
| II-3-21 | 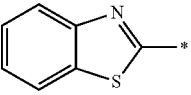 | 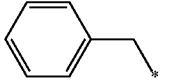 | H |

-continued
| No | Ax | Ay | Q2 |
|---|---|---|---|
| II-3-22 | benzothiazol-2-yl | *-S(O)₂-C₆H₄-CH₃ (tosyl) | H |
| II-3-23 | benzothiazol-2-yl | *-CH₂-O-CH₂CH₂-O-CH₃ | H |
| II-3-24 | benzothiazol-2-yl | CH₃CH₂CH₂-C(O)-* | H |
| II-3-25 | naphtho[1,2-d]thiazol-2-yl | C₆H₁₃ | H |
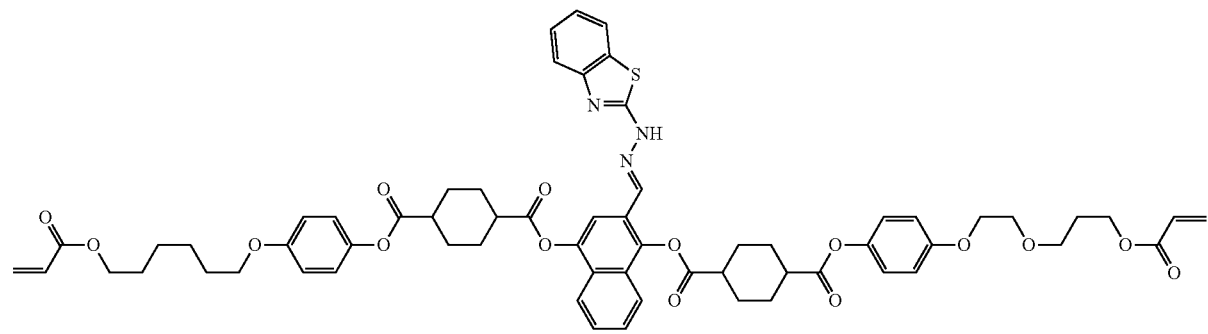
II-3-26
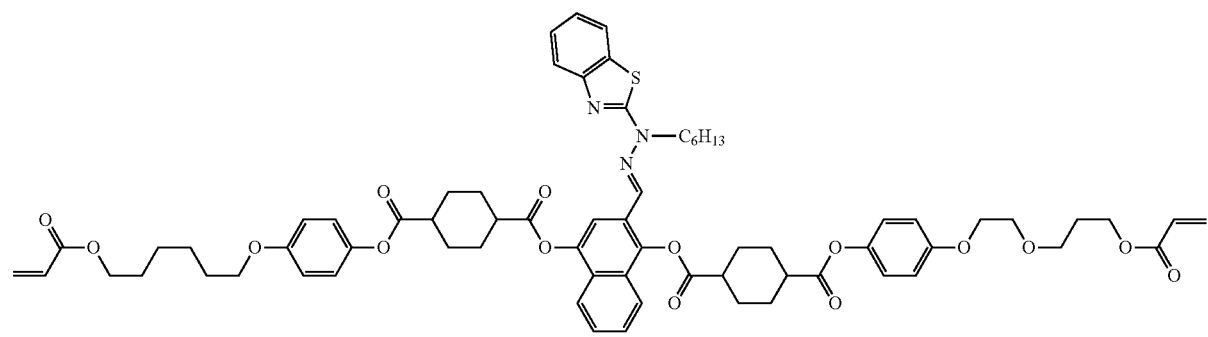
II-3-27

-continued
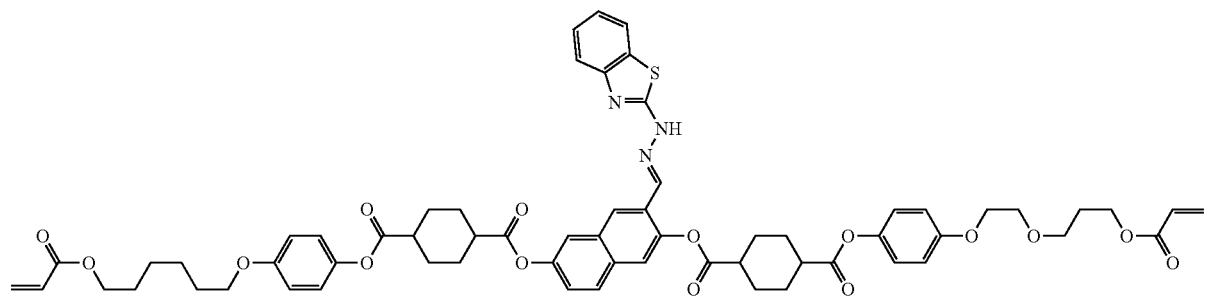
II-3-28
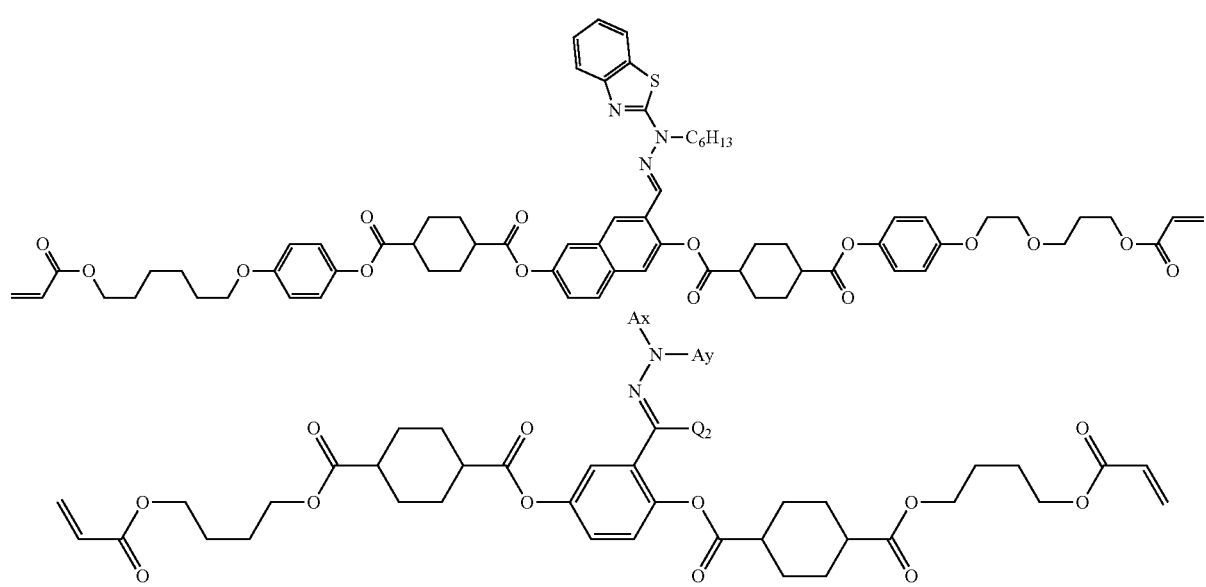
II-3-29
| No | Ax | Ay | Q2 |
|---|---|---|---|
| II-3-30 | benzothiazol-2-yl | H | H |
| II-3-31 | benzoxazol-2-yl | H | H |
| II-3-32 | naphthalen-1-yl | H | H |
| II-3-33 | Ph | Ph | H |
| II-3-34 | quinolin-2-yl | H | H |

-continued
| No | Ax | Ay | Q2 |
|---|---|---|---|
| II-3-35 | 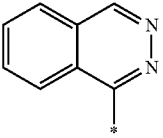 | H | H |
| II-3-36 | 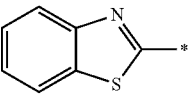 | CH₃ | H |
| II-3-37 | 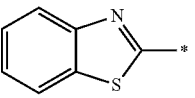 | C₄H₉ | H |
| II-3-38 | 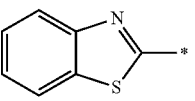 | C₈H₁₃ | H |
| II-3-39 | 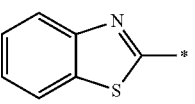 | 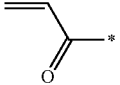 | H |
| II-3-40 | 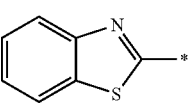 | 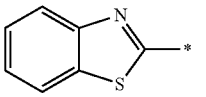 | H |
| II-3-41 | 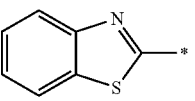 | CH₂CN | H |
| II-3-42 | 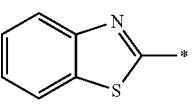 | 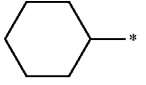 | H |
| II-3-43 | 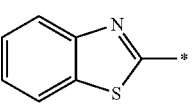 | 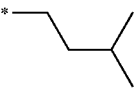 | H |
| II-3-46 | 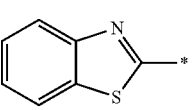 | CH₃CH₂OH | H |
| II-3-45 | 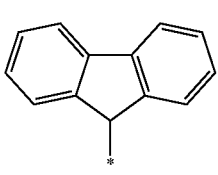 | H | H |
| II-3-46 | 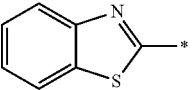 | CH₂CF₃ | H |
| II-3-47 | 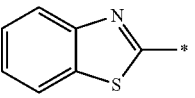 | H | CH₃ |

-continued
| No | Ax | Ay | Q2 |
|---|---|---|---|
| II-3-48 | 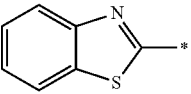 | 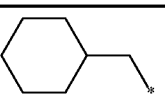 | H |
| II-3-49 | 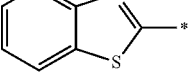 | 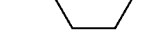 | H |
| II-3-50 | 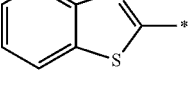 | 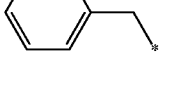 | H |
| II-3-51 | 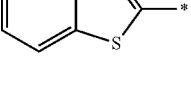 | 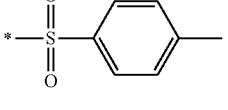 | H |
| II-3-52 | 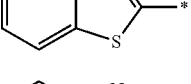 | 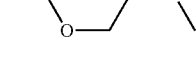 | H |
| II-3-53 | 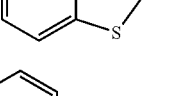 | 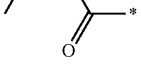 | H |
| II-3-54 | 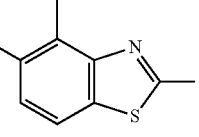 | $C_6H_{13}$ | H |
II-3-55
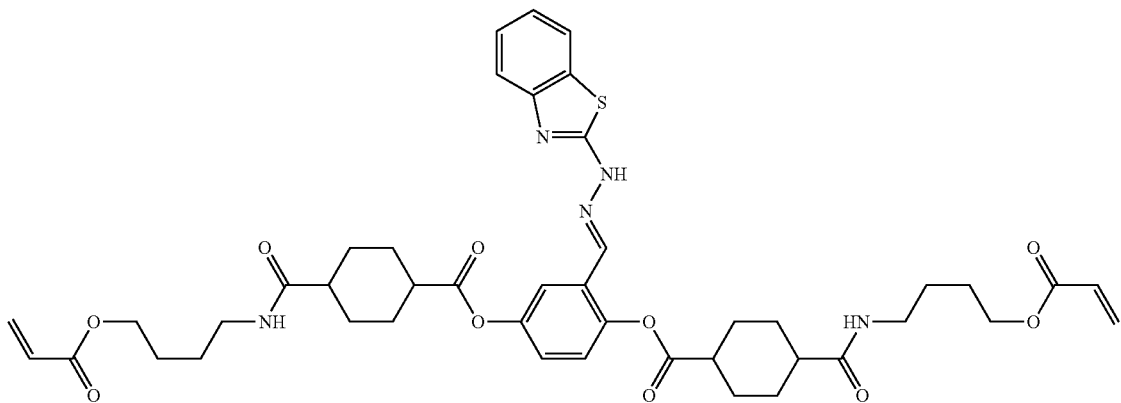

-continued

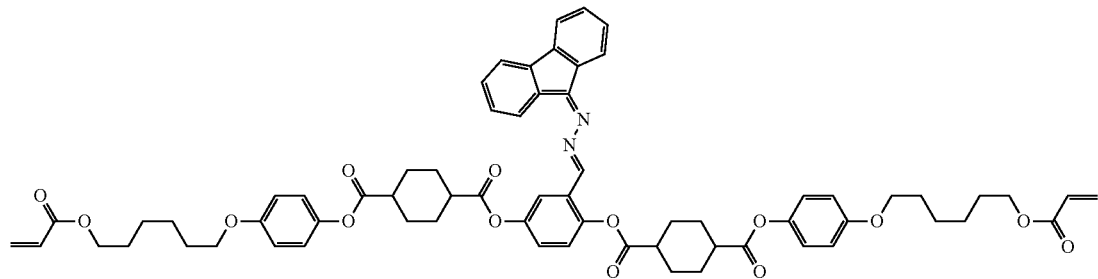

II-4-1

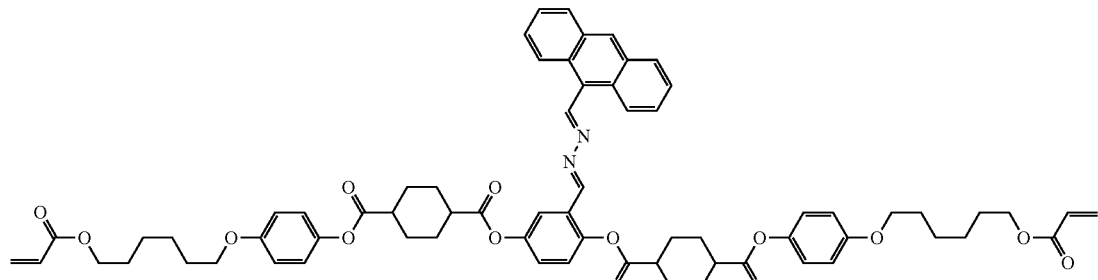

II-4-2

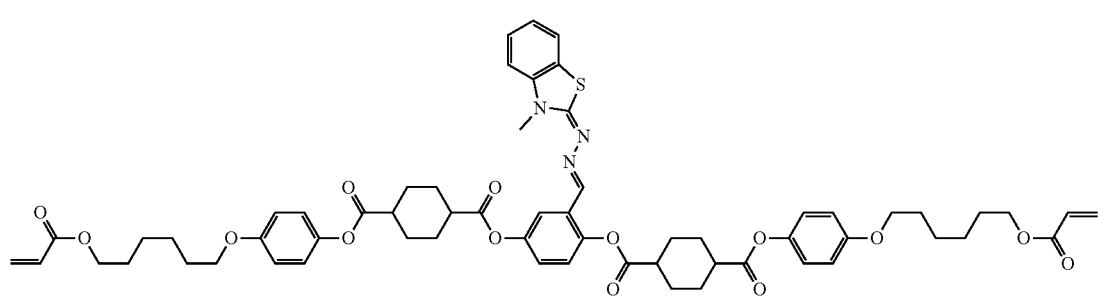

II-4-3

The rod-like liquid crystal compound exhibits reverse wavelength dispersibility and a smectic phase.

Examples of the liquid crystal compound exhibiting a smectic phase include a compound represented by Formula L-1 (liquid crystal compound L-1), a compound represented by Formula L-3 (liquid crystal compound L-3), a compound represented by Formula L-6 (liquid crystal compound L-6), a compound represented by Formula L-8 (liquid crystal compound L-8), and a compound represented by Formula L-10 (liquid crystal compound L-10).

The group adjacent to the acryloyloxy group in Formula L-1 represents a propylene group (a group in which a methyl group is substituted with an ethylene group), and the liquid crystal compound L-1 represents a mixture of positional isomers in which methyl group positions are different.

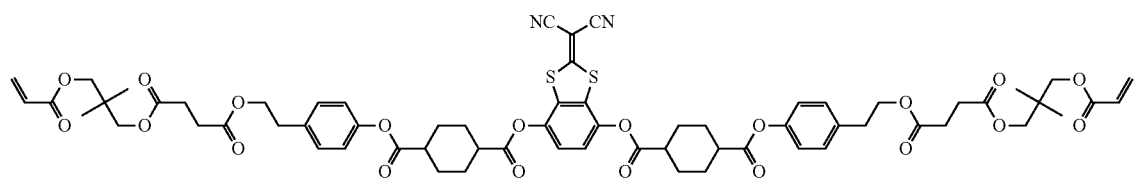

L-1

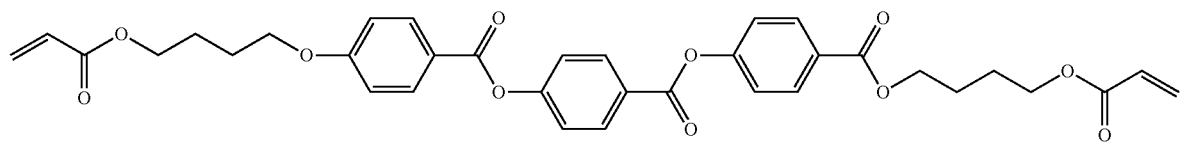

L-3

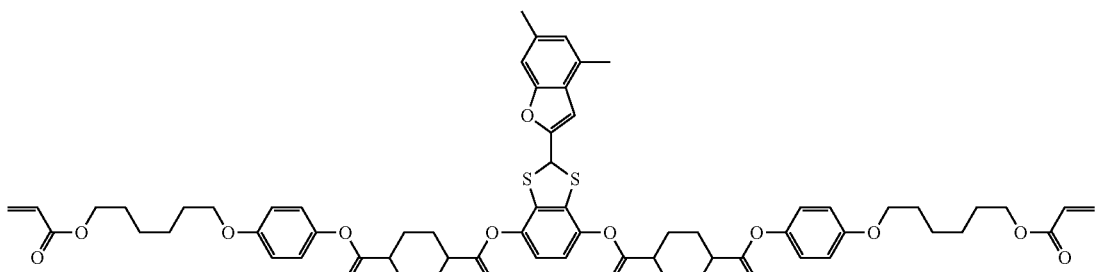

L-6

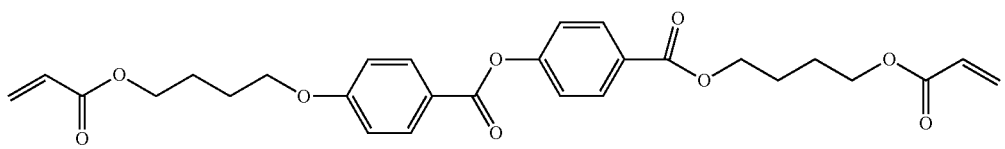

L-8

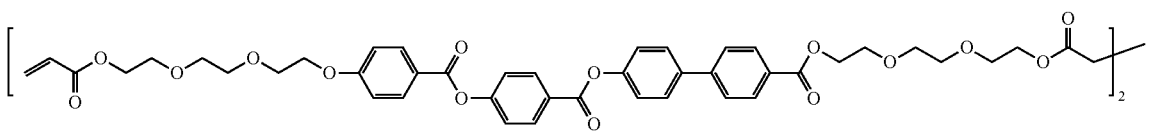

L-10

In addition, as the smectic liquid crystal compound, for the reason that the alignment of the smectic liquid crystal layer becomes more satisfactory due to an electronic interaction occurring between the liquid crystal molecules, a compound having a structure represented by Formula (1) is preferable.

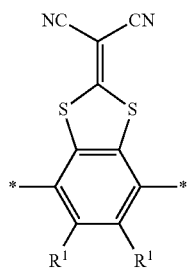

(1)

Here, in Formula (1), * represents a bonding position and $R^1$'s each independently represent a hydrogen atom or an alkyl group having 1 to 6 carbon atoms.

As the compound having the structure represented by Formula (1), the liquid crystal compound L-1 in which both $R^1$'s in Formula (1) represent a hydrogen atom is suitably used. The bonding position represented by * in Formula (1) represents a bonding position with an oxygen atom in the liquid crystal compound L-1.

(Other Liquid Crystal Compounds)

In the present invention, the optically anisotropic layer may include liquid crystal compounds other than the above-described liquid crystal compound exhibiting a smectic phase.

Examples of other liquid crystal compounds include a liquid crystal compound exhibiting a nematic phase, and specific examples thereof include a compound represented by Formula L-2 (liquid crystal compound L-2), a compound represented by Formula L-4 (liquid crystal compound L-4), a compound represented by Formula L-9 (liquid crystal compound L-9), and a compound represented by Formula L-11 (liquid crystal compound L-11), which are used in examples to be described later.

The group adjacent to the acryloyloxy group in Formula L-2 represents a propylene group (a group in which a methyl group is substituted with an ethylene group) and the liquid crystal compound L-2 represents a mixture of positional isomers in which methyl group positions are different.

In the case in which the optical film contains the above-described smectic liquid crystal compound and other liquid crystal compounds, the content ratio of the smectic liquid crystal compound is preferably at least 35% by mass or more with respect to the total mass of the smectic liquid crystal compound and other liquid crystal compounds.

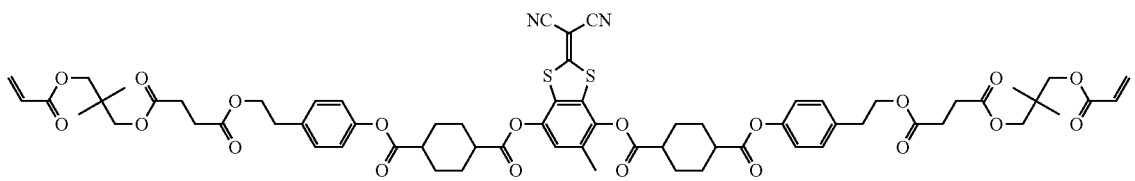

L-4
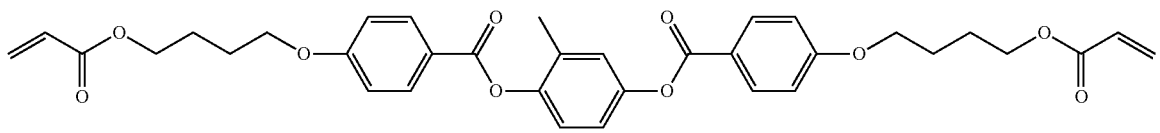

L-9
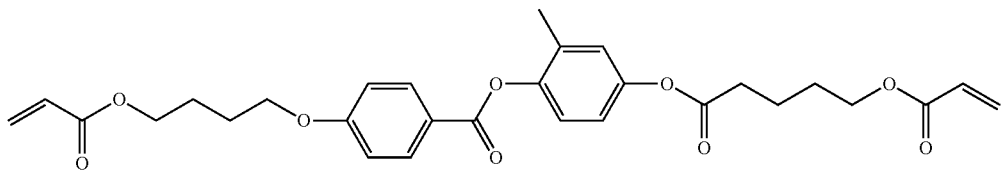

L-11
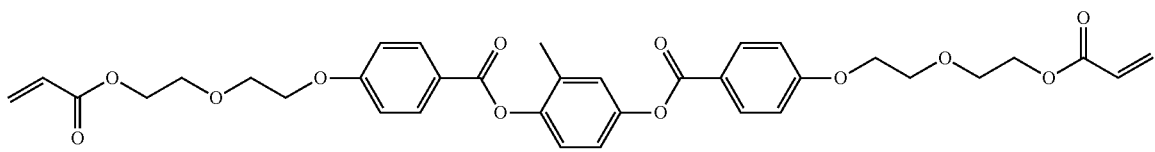

(Alkyl Cyclohexane Ring-Containing Compound)

The composition for a smectic liquid crystal layer may further contain a liquid crystal compound exhibiting normal dispersion wavelength properties other than the rod-like liquid crystal compound. Examples of the liquid crystal compound exhibiting normal dispersion wavelength properties include an alkyl cyclohexane ring-containing compound.

The alkyl cyclohexane ring-containing compound contained is a compound partially having a cyclohexane ring in which one hydrogen atom is substituted with a linear alkyl group.

Here, the expression "a cyclohexane ring in which one hydrogen atom is substituted with a linear alkyl group" refers to a cyclohexane ring in which, for example, in a case of a compound having two cyclohexane rings as shown in Formula (2), one hydrogen atom of the cyclohexane ring present on the molecule terminal side is substituted with a linear alkyl group.

Examples of the alkyl cyclohexane ring-containing compound include compounds having a structure represented by Formula (2) and among the compounds, from the viewpoint of imparting moisture-heat resistance to an optically anisotropic layer, a compound having a (meth)acryloyl group represented by Formula (3) is preferable.

(2)

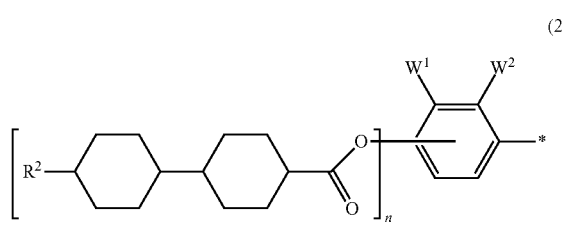

(3)

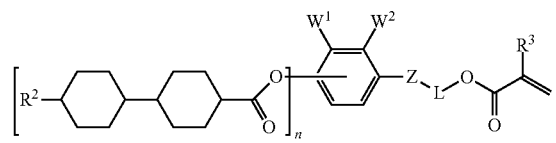

Here, in Formula (2), * represents a bonding position.

In addition, in Formulae (2) and (3), $R^2$ represents a linear alkyl group having 1 to 10 carbon atoms and n represents 1 or 2. $W^1$ and $W^2$ each represent an alkyl group, an alkoxy group, or a halogen atom, or $W^1$ and $W^2$ may be bonded to each other to form a ring structure which may have a substituent.

Further, in Formula (3), Z represents —COC— or —OCO—, L represents an alkylene group having 1 to 6 carbon atoms, and $R^3$ represents a hydrogen atom or a methyl group.

In addition, $R^2$ in Formulae (2) and (3) is preferably a linear alkyl group having 2 to 4 carbon atoms.

Specific examples of such an alkyl cyclohexane ring-containing compound include compounds represented by Formulae A-1 to A-5. In Formula A-3, $R^4$ represents an ethyl group or a butyl group.

A-1
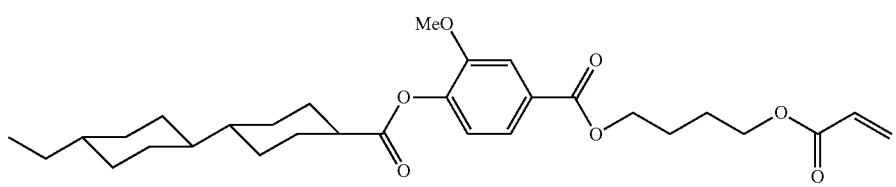

-continued

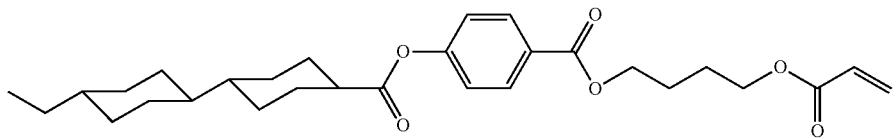

A-2

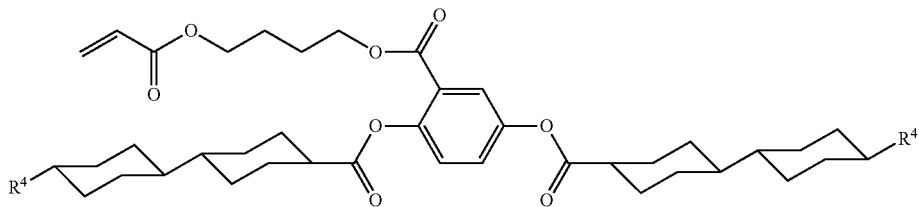

A-3

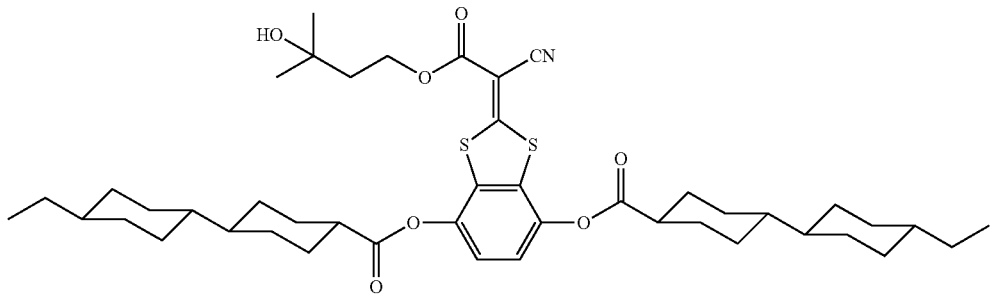

A-4

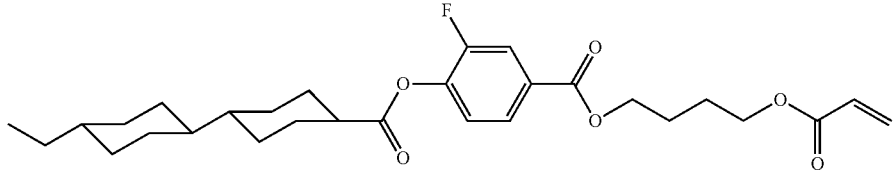

A-5

The amount of the liquid crystal compound in the composition for a smectic liquid crystal layer is preferably 50% to 98% by mass and more preferably 80% to 98% by mass with respect to the total solid content mass of the composition for a smectic liquid crystal layer.

Among the rod-like liquid crystal compounds, the composition preferably includes the reverse wavelength dispersion liquid crystal compound represented by Formula (II).

(Vertical Alignment Agent)

It is preferable that the composition for a smectic liquid crystal layer includes a vertical alignment agent. By incorporating the vertical alignment agent into the composition, the alignment of the liquid crystal compound can be more effectively performed. In the vertical alignment agent, at least one of a boronic acid compound or an onium salt is preferably used.

Specific examples of the boronic acid compound include compounds represented by the following formula.

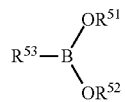

In the formula, $R^{51}$ and $R^{52}$ each independently represent a hydrogen atom, a substituted or unsubstituted aliphatic hydrocarbon group, an aryl group, or a heterocyclic group. $R^{53}$ represents a substituent including a functional group that can be bonded to a (meth)acryl group.

As a specific example of the boronic acid compound, the boronic acid compounds represented by Formula (I) described in paragraphs 0023 to 0032 of JP2008-225281A can be used. Further, the boronic acid compounds shown below are also preferably used.

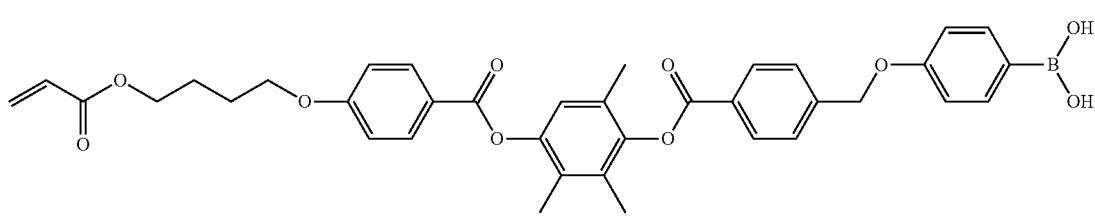

1-34)

1-35)

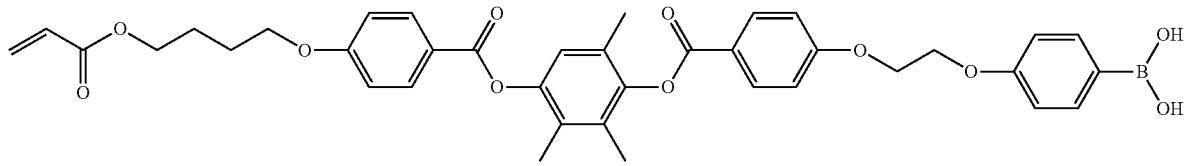

1-36)

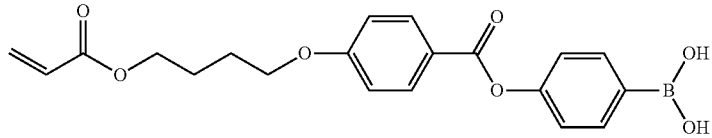

Specific examples of the onium salt include compounds represented by the following formula.

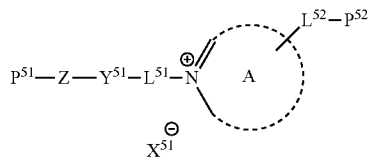

In the formula, ring A represents a quaternary ammonium ion formed of a nitrogen-containing heterocycle. $X^{51}$ represents an anion. $L^{51}$ represents a divalent linking group. $L^{52}$ represents a single bond or a divalent linking group. $Y^{51}$ represents a divalent linking group including a 5- or 6-membered ring as a partial structure. Z represents a divalent linking group including a $C_2$ to $C_{20}$ alkylene group as a partial structure. $P^{51}$ and $P^{52}$ each independently represent a monovalent substituent having a polymerizable ethylenically unsaturated group.

Specific examples of the onium salt include the onium salts described in paragraphs 0052 to 0058 of JP2012-208397A, the onium salts described in paragraphs 0024 to 0055 of JP2008-026730A, and the onium salts described in JP2002-37777A.

The amount of the vertical alignment agent contained is preferably 0.1% to 5% by mass, and more preferably 0.5% s to 3% by mass with respect to the total mass of the liquid crystal compound contained in the composition for a smectic liquid crystal layer. The composition may contain one kind or two or more kinds of vertical alignment agents. In a case where the composition contains two or more vertical alignment agents, the total amount thereof is set within the above range.

Further, the composition for a smectic liquid crystal layer may include a polymerization initiator, a non-liquid crystal polymerizable compound, a solvent, other additives, and the like.

(Polymerizable Compound)

The composition for a smectic liquid crystal layer may include a polymerizable compound.

The polymerizable compound that is used in combination with a liquid crystal compound is not particularly limited as long as the compound has compatibility with the liquid crystal compound and does not remarkably cause a change in the tilt angle and inhibition of alignment of the liquid crystal compound. Among these, a compound having an ethylenically unsaturated group which is polymerizable active, such as a vinyl group, a vinyloxy group, an acryloyl group, and a methacryloyl group, is preferably used.

As the polymerizable compound, a polymerizable compound having two or more reactive functional groups is particularly preferably used, which is expected to promote adhesiveness between an alignment layer and a liquid crystal layer. The polymerizable compound may be a polymer, but is preferably a monomer (for example, a monomer having a molecular weight of 2000 or less).

Specific examples of the polymerizable compound include esters of polyhydric alcohol and (meth)acrylic acid (for example, ethylene glycol di(meth)acrylate, 1,4-cyclohexane diacrylate, pentaerythritol tetra(meth)acrylate, pentaerythritol tri(meth)acrylate, trimethylol propane tri(meth)acrylate, trimethylolethane tri(meth)acrylate, dipentaerythritol tetra(meth)acrylate, dipentaerythritol penta(meth)acrylate, dipentaerythritol hexa(meth)acrylate, 1,2,3-cyclohexane tetramethacrylate, polyurethane polyacrylate, and polyester polyacrylate), vinylbenzene and derivatives thereof (for example, 1,4-divinylbenzene, 4-vinylbenzoic acid-2-acryloylethyl ester, and 1,4-divinylcyclohexanone), vinyl sulfone (for example, divinyl sulfone), acrylamide (for example, methylene-bisacrylamide), and methacrylamide.

One kind or two or more kinds of the polymerizable compounds may be contained in the composition for a smectic liquid crystal layer. The content of the polymerizable compound is generally in the range of 0.5% to 50% by mass and preferably in the range of 1% to 30% by mass with respect to the liquid crystal compound.

(Polymerization Initiator)

The composition for a smectic liquid crystal layer may include a polymerization initiator. The polymerization initiator is preferably incorporated in a case where the liquid crystal compound has a polymerizable group or in a case where the liquid crystal compound has a polymerizable compound. Specific examples of the polymerization initiator include α-carbonyl compounds (described in U.S. Pat. Nos. 2,367,661 and 2,367,670A), acyloin ethers (described in U.S. Pat. No. 2,448,828A), α-hydrocarbon-substituted aromatic acyloin compounds (described in U.S. Pat. No. 2,722,512A), polynuclear quinone compounds (described in U.S. Pat. Nos. 3,046,127A and 2,951,758A), combinations of triaryl imidazole dimer and p-aminophenyl ketone (described in U.S. Pat. No. 3,549,367A), acridine and phenazine compounds (described in JP1985-105667A (JP-S60-105667A), and U.S. Pat. No. 4,239,850A), oxadiazole compounds (described in U.S. Pat. No. 4,212,970A), and acylphosphine oxide compounds (described in JP1988-

40799B (JP-S63-40799B), JP1993-29234B (JP-H05-29234B), JP1998-95788A (JP-H10-95788A), and JP1998-29997A (JP-H10-29997A).

Specific examples of a photopolymerization initiator as the polymerization initiator include Irgacure (registered trademark) series (for example, Irgacure 651, Irgacure 754, Irgacure 184, Irgacure 2959, Irgacure 907, Irgacure 369, Irgacure 379, and Irgacure 819) and Darocure (registered trademark) series (for example, Darocure TPO and Darocure 1173, commercially available from BASF SE), Quantacure PDO, and Ezacure (registered trademark) series (for example, Esacure TZM, Esacure TZT, and Esacure KTO 46) commercially available from Lamberti.

The amount of the photopolymerization initiator used is preferably 0.01% to 20% by mass and more preferably 0.5% to 5% by mass of the solid content of the composition for a smectic liquid crystal layer.

(Solvent)

The composition for a smectic liquid crystal layer may include a solvent. As the solvent of the composition, an organic solvent is preferably used. Examples of the organic solvent include amides (for example, N,N-dimethyl formamide), sulfoxides (for example, dimethyl sulfoxide), heterocyclic compounds (for example, pyridine), hydrocarbons (for example, benzene and hexane), alkyl halides (for example, chloroform and dichloromethane), esters (for example, methyl acetate and butyl acetate), ketones (for example, acetone, methyl ethyl ketone, and cyclohexanone), and ethers (for example, tetrahydrofuran and 1,2-dimethoxyethane). Alkyl halides and ketones are preferable. As the solvent, one kind or a combination of two or more kinds of organic solvents may be used. The solvent is preferably prepared such that the concentration of the solid contents of the composition is 10% to 50% by mass.

(Other Additives)

The composition for a smectic liquid crystal layer may include a surfactant for controlling surface properties or a surface shape, a chemical agent for imparting other functions, or the like in addition to the above components.

<Method for Forming Smectic Liquid Crystal Layer>

The smectic liquid crystal layer can be formed by applying the composition for a smectic liquid crystal layer onto a support and drying and curing the composition.

(Support)

The optical film of the present invention may include a support. The support is a layer having a function as a base material for applying the composition for a smectic liquid crystal layer or having a function of maintaining a layer shape of a smectic phase. The support may be a temporary support which is to be peeled off after the coating liquid for a smectic liquid crystal layer is applied and cured, or a temporary support which is to be peeled off after being stretched. That is, the optical film of the present invention may not include the support. In a case of using the support after peeling, a material having a surface property that the material is easily peeled off is preferably used.

As the support (temporary support), a plastic film as well as glass or the like may be used. Examples of the plastic film include polyesters such as polyethylene terephthalate (PET), polycarbonates, acrylic resins, epoxy resins, polyurethanes, polyamides, polyolefins, cellulose derivatives, silicones, and polyvinyl alcohols (PVA).

Among these, the smectic liquid crystal layer may be formed of a material that can be stretched for performing fixed end uniaxial stretching after the layer is formed by application and cured. For example, PET and an acrylic resin are more preferable and an acrylic resin is even more preferable.

The film thickness of the support may be about 5 µm to 1000 m, preferably 10 µm to 250 µm, and more preferably 15 µm to 90 µm.

(Coating Method)

Examples of a method used in a case where the composition for a smectic liquid crystal layer is applied include known methods such as a curtain coating method, a dip coating method, a spin coating method, a printing coating method, a spray coating method, a slot coating method, a roll coating method, a slide coating method, a blade coating method, a gravure coating method, and a wire bar method. A single layer coating is preferable in a case of using any of these coating methods.

(Alignment of Liquid Crystal Compound)

Before the composition for a smectic liquid crystal layer is cured, an alignment treatment is performed. The alignment treatment can be performed by drying at room temperature or the like or by heating. In a case of a thermotropic liquid crystal compound, the liquid crystal phase formed in the alignment treatment can generally be transferred by a change in temperature or pressure. In a case of a liquid crystal compound having lyotropic properties, the liquid crystal phase can also be transferred according to the compositional ratio such as the amount of a solvent.

In a case where the rod-like liquid crystal compound exhibits a smectic phase, it is common that a temperature range in which the rod-like liquid crystal compound exhibits a nematic phase is higher than a temperature range in which the rod-like liquid crystal compound exhibits the smectic phase. Accordingly, the rod-like liquid crystal compound can be transferred from a nematic phase to a smectic phase by heating the rod-like liquid crystal compound to the temperature range in which the rod-like liquid crystal compound exhibits a nematic phase, and then lowering the heating temperature to the temperature range in which the rod-like liquid crystal compound exhibits a smectic phase. By transferring the nematic phase to the smectic phase by such a method, a smectic liquid crystal layer in which the liquid crystal compound is aligned highly in order can be provided.

In the temperature range in which the rod-like liquid crystal compound exhibits a nematic phase, it is necessary to heat the rod-like liquid crystal compound for a predetermined period of time until the compound forms a monodomain. The heating time is preferably from 10 seconds to 5 minutes, more preferably from 10 seconds to 3 minutes, and most preferably from 10 seconds to 2 minutes.

In the temperature band in which the rod-like liquid crystal compound exhibits a smectic phase, it is necessary to heat the rod-like liquid crystal compound for a predetermined period of time until the compound exhibits a smectic phase. The heating time is preferably from 10 seconds to 5 minutes, more preferably from 10 seconds to 3 minutes, and most preferably from 10 seconds to 2 minutes.

(Fixation of Alignment State)

Fixation of an alignment state can be performed through thermal polymerization or polymerization by active energy rays and can also be performed by appropriately selecting a polymerizable group or a polymerization initiator that is suitable for the polymerization. Further, a polymerization reaction by irradiation with ultraviolet rays can be preferably used, taking into consideration of production suitability and the like. In a case where the irradiation amount of ultraviolet rays is small, the unpolymerizable rod-like liquid crystal compound remains, which leads to deterioration of optical properties due to temperature change or time passage.

Therefore, it is preferable to determine the irradiation condition such that the ratio of the remaining polymerizable rod-like liquid crystal compound becomes 5% or less. The irradiation condition may depend on the formulation of the polymerizable composition or the film thickness of the liquid crystal layer, but the irradiation is preferably performed at an irradiation amount of 100 to 1000 mJ/cm$^2$ or more as a standard.

(Smectic Liquid Crystal Layer)

The smectic liquid crystal layer has a liquid crystal compound homeotropically aligned. The homeotropic alignment means a state in which the molecular long axis of the liquid crystal compound is aligned in the vertical direction. In a case where the liquid crystal layer exhibits a smectic phase, a layer structure of high order in which the positions of the centers of gravity of the liquid crystal molecules are aligned is taken and thus homeotropic alignment is easily taken, and further, in a case where the alignment regulating force of a layer forming surface (base surface) of a base material is weak, a liquid crystal layer with good homeotropic alignment can be obtained.

<<Use of Optical Film>>

The optical film of the present invention is useful as, for example, an λ/2 optical compensation film that optically compensates a liquid crystal cell, or as a broadband λ/4 antireflection film used in an organic EL display device.

The optical film of the present invention can be suitably used as an optical compensation film of an IPS liquid crystal display device or a liquid crystal display device and a change in tint when visually recognized in the oblique direction or light leakage during a black display can be improved.

(Adhesive)

In a case of pressing an optical film, a display device, or the like, an adhesive may be used for bonding the respective members. In the present specification, "adhesion" is used in the concept that includes "pressure sensitive adhesiveness". The adhesive not particularly limited, but examples thereof include a polyvinyl alcohol-based adhesive, an aqueous boron compound solution, a curable adhesive of an epoxy compound containing no aromatic ring in the molecule, as described in JP2004-245925A, an active energy ray-curable adhesive having a photopolymerization initiator having a molar light absorption coefficient of 400 or more at a wavelength of 360 to 450 nm and an ultraviolet curable compound as essential components, as described in JP2008-174667A, and an active energy ray-curable adhesive including (a) a (meth)acryl-based compound having two or more (meth)acryloyl groups in the molecule, (b) a (meth)acryl-based compound having a hydroxyl group in the molecule and one polymerizable double bond, and (c) a phenol ethylene oxide-modified acrylate or nonyl phenol ethylene oxide-modified acrylate in the total amount of 100 parts by mass of the (meth)acryl-based compound described in JP2008-174667A.

Furthermore, the polyvinyl alcohol-based adhesive is an adhesive containing a modified or non-modified polyvinyl alcohol. The polyvinyl alcohol-based adhesive may contain a modified or non-modified polyvinyl alcohol and a cross-linking agent. Specific examples of the adhesive include an aqueous solution of a polyvinyl alcohol or a polyvinyl acetal (for example, polyvinyl butyral), and a latex of a vinyl-based polymer (for example, polyvinyl chloride, polyvinyl acetate, and polybutyl acrylate). A particularly preferred adhesive is an aqueous solution of a polyvinyl alcohol. Here, the polyvinyl alcohol is preferably in the state of being completely saponified.

The film thickness of the adhesive layer formed by the adhesive is preferably 0.01 to 10 μm, and particularly preferably 0.05 to 5 μm, in terms of a dry film thickness.

<<Display Device>>

A display device of the present invention includes the optical film of the present invention. As examples of the display device, an organic EL display device and an IPS liquid crystal display device will be described.

<Organic EL Display Device>

An embodiment of the organic EL display device will be described. FIG. 3 shows a schematic cross-sectional view showing an embodiment of the organic EL display device.

As shown in FIG. 3, an organic EL display device 30 includes an antireflection film (λ/4 plate) 32 and a polarizer 36 on an organic EL panel 31. The antireflection film 32 is the optical film of the present invention. The polarizer 36 side is a visible side. The organic EL panel 31 has a light emitting layer 35 arranged between a pair of electrodes of a rear surface electrode 33 and a transparent electrode 34. Holes injected from the rear surface electrode 33 and electrons injected from the transparent electrode 34 are recombined in the light emitting layer 35 to emit light by excitation of a fluorescent substance or the like. The light emitted from the light emitting layer 35 is emitted from the transparent electrode 34 directly or by reflection on the rear surface electrode 33. The organic EL display device has an antireflection function due to the antireflection film 32 and the polarizer 36. Specifically, incident rays from outside are converted into linearly polarized light by the polarizer 36, and the linearly polarized light is further converted into circularly polarized light by the antireflection film 32. The circularly polarized light is converted into circularly polarized light of reverse rotation to reflected incident rays by the transparent electrode 34. Since the circularly polarized light is converted into linearly polarized light in a direction orthogonal to the incidence rays by the antireflection film 32, the circularly polarized light does not pass through the polarizer 36.

The organic EL panel 31 is a member formed by a plurality of organic compound thin films, and may have, in addition to the light emitting layer 35, a hole injecting layer, a hole transporting layer, an electron injecting layer, an electron transporting layer, a protective layer, and the like. Each of these layers may have different functions from each other. For the formation of the respective layers, various materials can be used.

The rear surface electrode 33 is provided for supplying holes to the hole injecting layer, the hole transporting layer, the light emitting layer, and the like and can be formed of a metal, an alloy, a metal oxide, an electroconductive compound, or a mixture thereof. The rear surface electrode is preferably formed of a material having a work function of 4 eV or higher. Specific examples of the material include an electroconductive metal oxide such as tin oxide, zinc oxide, indium oxide, and indium-tin oxide (ITO); a metal such as gold, silver, chromium, and nickel; a mixture or a laminate of those metals and electroconductive metal oxides; an inorganic electroconductive substance such as copper iodide and copper sulfide; an organic electroconductive material such as polyaniline, polythiophene, and polypyrrole; and a laminate of these materials and ITO. Preferable are electroconductive metal oxides, and particularly, ITO is preferable form the viewpoints of productivity, high electrical conductivity, transparency, and the like. Although the film thickness of the rear surface electrode 33 can be appropriately selected depending on the material thereof, it is usually preferably 10 nm to 5 µm, more preferably 50 nm to 1 µm, and still more preferably from 100 nm to 500 nm. In the organic EL display device, the optical film of the present invention is provided as an antireflection film and thus front surface contrast and oblique tint are improved.

<IPS Liquid Crystal Display Device>

Next, an IPS liquid crystal display device including the optical film of the present invention will be described. FIG. 4 shows a schematic cross-sectional view of an embodiment of an IPS liquid crystal display device.

As shown in FIG. 4, an IPS liquid crystal display device 40 of an embodiment includes an IPS liquid crystal cell 43 arranged between two polarizing plates 41 and 42. The polarizing plate 42 (λ/2 plate) is the optical film of the present invention. In the liquid crystal cell 43, liquid crystal molecules (46a and 46b) are sealed between glass substrates 44 and 45. Transparent anodes 47 and transparent cathodes 48 are formed on the glass substrate 44. In a state in which voltage is not applied, liquid crystal molecules are arranged parallel to the transparent anode 47 and the transparent cathode 48 like the liquid crystal molecules 46a, but in a state in which voltage is applied, liquid crystal molecules are horizontally rotated by 90 degrees and arranged over the transparent anode 47 and the transparent cathode 48 like the liquid crystal molecules 46b. Since the liquid crystal molecules are rotated by 90 degrees in the in-plane direction by non-voltage application and voltage application, transmission or shielding is made between two polarizing plates.

In the IPS liquid crystal display devices, the liquid crystal molecules are rotated in a horizontal plane with respect to the glass substrate. Therefore, since the liquid crystal molecules are not obliquely arranged, a change in optical properties depending on the view angle is small and a wide view angle is obtained. By using the optical film of the present invention for such an IPS liquid crystal display device, the view angle is further improved.

EXAMPLES

The characteristics of the present invention will be described below in further detail based on Examples and Comparative Examples. The materials, amounts used, ratios, treatments, treatment procedures, and the like shown in the examples below can be modified as appropriate in the range of not departing from the spirit of the present invention. Therefore, the scope of the present invention should not be construed as being limited to the following specific examples.

Hereinafter, the optical film of the present invention is used as an antireflection film (λ/4 plate) of an organic EL display device will be described.

Example 1

First, a support used in Example 1 will be described.
<Support>

Pellets of [a mixture of 90 parts by mass of an acrylic resin having a lactone ring structure represented by Formula (III) {copolymerizable monomer mass ratio=methyl methacrylate/2-(hydroxymethyl)methyl acrylate=8/2, a lactone ring formation rate: about 100%, a content ratio of the lactone ring structure: 19.4%, a weight average molecular weight: 133,000, a melt flow rate: 6.5 g/10 min (240° C., 10 kgf), Tg: 131° C.}, and 10 parts by mass of an acrylonitrile-styrene (AS) resin {TOYO AS AS20, manufactured by TOYO STYRENE Co., Ltd.}; Tg: 127° C.] were supplied to a twin screw extruder, and melted and extruded in a sheet form at about 280° C. to obtain a long temporary support having a thickness of 40 m.

(III)

In Formula (III), $R^1$ represents a hydrogen atom and $R^2$ and $R^3$ represent a methyl group.

<Formation of Alignment Layer>

(Alkali Saponification Treatment)

The temporary support was allowed to pass through dielectric heating rolls at a temperature of 60° C. to increase the film surface temperature to 40° C. and then an alkali solution having the following composition was applied onto a band surface of the film in a coating amount of 14 ml/m$^2$, using a bar coater. Thereafter, the support was heated to 110° C. and transported below a steam type far infrared ray heater manufactured by Noritake Co., Ltd. for 10 seconds. Subsequently, using a bar coater in the same manner as described above, pure water was applied onto the surface coated with the alkali solution in an amount of 3 ml/m$^2$. Next, washing with water using a fountain coater and then dehydration using an air knife were repeated three times, respectively. Subsequently, the film was transported into a drying zone at 70° C. for 10 seconds, and dried to prepare an alkali saponification-treated support. In the support, the effect of wavelength dispersion, Re(550) or Rth(550) can be ignored.

—Alkali Solution Composition—

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(Formation of Alignment Layer)

Subsequently, an alignment layer coating liquid A of the following composition was continuously applied to the alkali saponification-treated surface of the support using a wire bar #14. The coated surface was dried with hot air at 60° C. for 60 seconds and further dried with hot air at 100° C. for 120 seconds. The saponification degree of modified polyvinyl alcohol used was 96.8%. —Composition of Alignment Layer Coating Liquid A—

| | |
|---|---|
| Modified polyvinyl alcohol shown below | 10 parts by mass |
| Water | 308 parts by mass |
| Methanol | 70 parts by mass |
| Isopropanol | 29 parts by mass |

Photopolymerization initiator (Irgacure 2959 (registered trademark), manufactured by BASF SE) 0.8 parts by mass Modified Polyvinyl Alcohol

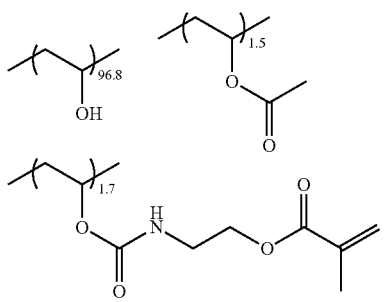

The compositional ratio of the modified polyvinyl alcohol is a molar fraction.

<Formation of Smectic Liquid Crystal Layer>

Next, a smectic liquid crystal layer in which liquid crystal molecules are vertically aligned and fixed in a smectic phase will be described.

The coating liquid for the smectic liquid crystal layer was dissolved in methyl ethyl ketone (MEK) and prepared such that the concentration of the solid contents was 33% by mass. The coating liquid was applied to the alignment layer using a bar coater and heated and aged at 80° C. for 2 minutes. Thus, a homogeneous alignment state was obtained. Then, the coating film was kept at 80° C. and was irradiated with ultraviolet rays at 100 mJ/cm$^2$ using a metal halide lamp at 80° C. to form a film. At this time, the film thickness was 8 μm. The details of compounds used in the coating liquid are described below. —Coating Liquid for Smectic Liquid Crystal Layer of Example 1—

| | |
|---|---|
| Reverse wavelength dispersion rod-like liquid crystal compound L-1 | 44 parts by mass |
| Reverse wavelength dispersion rod-like liquid crystal compound L-2 | 44 parts by mass |
| Normal wavelength dispersion rod-like liquid crystal compound A-1 | 12 parts by mass |
| Polymerization initiator 1 | 1.5 parts by mass |
| Polymerization initiator 2 (Irgacure 184, manufactured by BASF SE) | 1.5 parts by mass |
| Vertical alignment agent | 0.5 parts by mass |
| Polymerizable compound | 0.5 parts by mass |
| Surfactant 1 | 0.2 parts by mass |
| Surfactant 2 | 0.4 parts by mass |

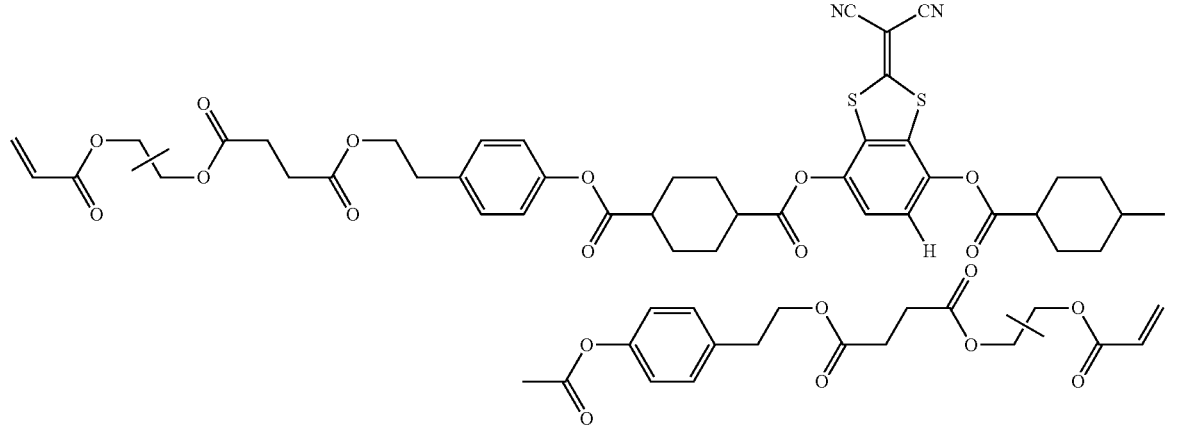

L-1

Me Position Isomer Mixture

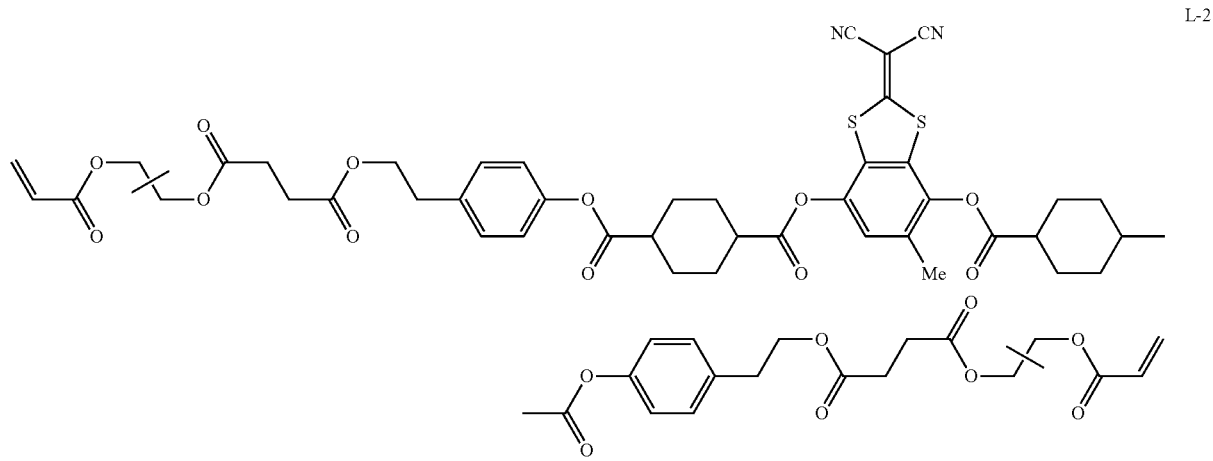

L-2

Me Position Isomer Mixture

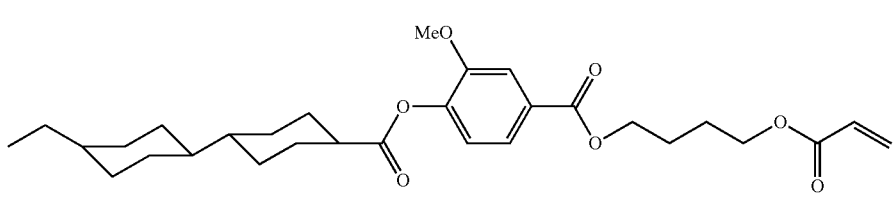

Polymerization Initiator 1

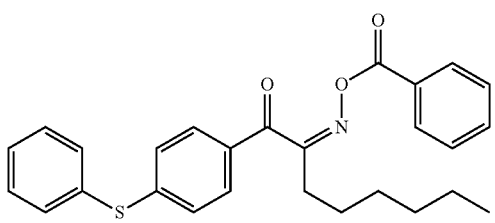 [SMILES: CCCCCC/C(=N/OC(=O)c1ccccc1)C(=O)c1ccc(Sc2ccccc2)cc1]

Polymerization Initiator 2

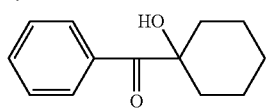

Vertical Alignment Agent

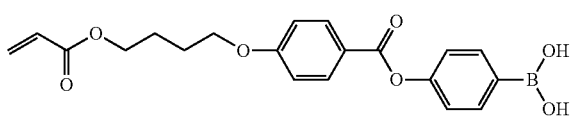 [SMILES: C=CC(=O)OCCCCOc1ccc(C(=O)Oc2ccc(B(O)O)cc2)cc1]

Polymerizable Compound

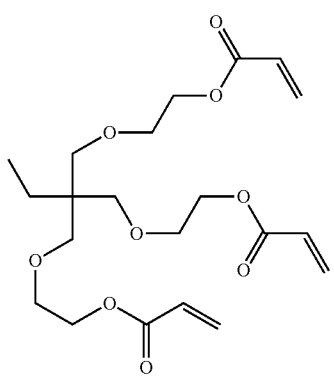 [SMILES: C=CC(=O)OCCOCC(CC)(COCCOC(=O)C=C)COCCOC(=O)C=C]

Surfactant 1

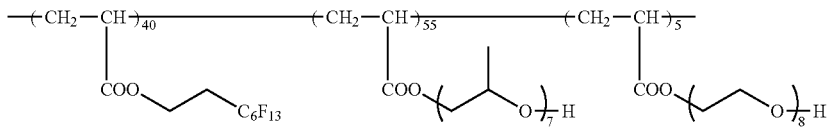

The ratio is a mass ratio.

Surfactant 2

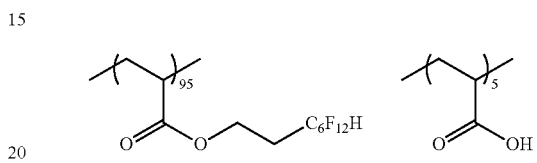

The ratio is a mass ratio.

<Fixed End Uniaxial Stretching>

The film prepared as described above was subjected to 50% fixed end uniaxial stretching at 140° C. The stretched liquid crystal layer exhibited a smectic phase and reverse wavelength dispersibility, and the film thickness after stretching was 5 μm.

Example 2

An optical film was prepared in the same manner as in Example 1 except that the following coating liquid for a smectic liquid crystal layer was used. The liquid crystal layer obtained by stretching exhibited a smectic phase and flat wavelength dispersibility. —Coating Liquid for Smectic Liquid Crystal Layer of Example 2—

| | |
|---|---|
| Reverse wavelength dispersion rod-like liquid crystal compound L-1 above | 44 parts by mass |
| Reverse wavelength dispersion rod-like liquid crystal compound L-2 above | 31 parts by mass |
| Normal wavelength dispersion liquid crystal compound A-1 above | 25 parts by mass |
| Polymerization initiator 1 | 1.5 parts by mass |
| Polymerization initiator 2 (Irgacure 184, manufactured by BASF SE) | 1.5 parts by mass |
| Vertical alignment agent | 0.5 parts by mass |
| Polymerizable compound | 12 parts by mass |
| Surfactant 1 | 0.2 parts by mass |
| Surfactant 2 | 0.4 parts by mass |

Example 3

An optical film was prepared in the same manner as in Example 1 except that the following coating liquid for a smectic liquid crystal layer was used. The liquid crystal layer obtained by stretching exhibited a smectic phase and normal wavelength dispersibility.

—Coating Liquid for Smectic Liquid Crystal Layer of Example 3—

| | |
|---|---|
| Reverse wavelength dispersion rod-like liquid crystal compound L-1 above | 44 parts by mass |
| Reverse wavelength dispersion rod-like liquid crystal compound L-2 above | 12 parts by mass |
| Normal wavelength dispersion liquid crystal compound A-1 above | 44 parts by mass |
| Polymerization initiator 1 | 1.5 parts by mass |
| Polymerization initiator 2 (Irgacure 184, manufactured by BASF SE) | 1.5 parts by mass |
| Vertical alignment agent | 0.5 parts by mass |
| Polymerizable compound | 12 parts by mass |
| Surfactant 1 | 0.2 parts by mass |
| Surfactant 2 | 0.4 parts by mass |

Example 4

An optical film was prepared in the same manner as in Example 2 except that the stretching ratio was changed to 45%. The liquid crystal layer obtained by stretching exhibited a smectic phase and flat wavelength dispersibility.

Example 5

An optical film was prepared in the same manner as in Example 2 except that the stretching ratio was changed to 55%. The liquid crystal layer obtained by stretching exhibited a smectic phase and flat wavelength dispersibility.

Example 6

An optical film was prepared in the same manner as in Example 1 except that the stretching ratio was changed to 40%. The liquid crystal layer obtained by stretching exhibited a smectic phase and reverse wavelength dispersibility.

Example 7

An optical film was prepared in the same manner as in Example 2 except that the stretching ratio was changed to 60%. The liquid crystal layer obtained by stretching exhibited a smectic phase and flat wavelength dispersibility.

Example 8

An optical film was prepared in the same manner as in Example 1 except that the stretching ratio was changed to 65%. The liquid crystal layer obtained by stretching exhibited a smectic phase and reverse wavelength dispersibility.

Comparative Example 1

An alignment layer was formed in the same manner as in Example 1 and a film with an alignment layer was rubbed in a transverse direction (TD).

<Preparation of Polarizing Plate with Positive A-Plate>

Next, the following coating liquid for forming a positive A-plate was prepared.

—Coating Liquid for Forming Positive A-Plate—

| | |
|---|---|
| Reverse wavelength dispersion rod-like liquid crystal compound L-1 above | 40.00 parts by mass |
| Reverse wavelength dispersion rod-like liquid crystal compound L-2 | 40.00 parts by mass |
| Normal wavelength dispersion liquid crystal compound A-1 above | 20.00 parts by mass |
| Polymerization initiator (IRGACURE 184, manufactured by BASF SE) | 3.00 parts by mass |
| Polymerization initiator (IRGACURE OXE-01, manufactured by BASF SE) | 3.00 parts by mass |
| Crosslinkable polymer O-2 | 0.30 parts by mass |
| Leveling agent (Compound T-1 shown below) | 0.20 parts by mass |
| Cyclopentanone | 423.11 parts by mass |

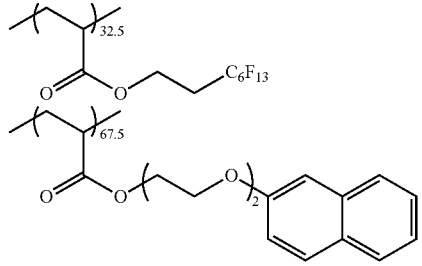

Crosslinkable polymer O-2

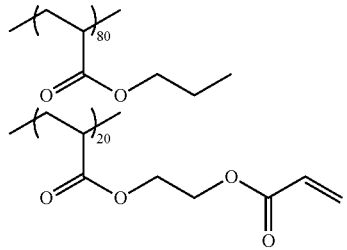

Tg = 10° C.

The ratio in Compound T-1 is a mass ratio.
The ratio of Crosslinkable polymer O-2 is a mass ratio.

Next, the coating liquid for forming a positive A-plate was applied to the alignment film using a bar coater such that the film thickness of the liquid crystal layer was 1 μm. The coating liquid was heated and aged at a film surface temperature of 80° C. for 20 seconds and was irradiated with ultraviolet rays at 1000 mJ/cm² using an air-cooled metal halide lamp (manufactured by Eye Graphics Co., Ltd.) under an atmospheric air, and the alignment state thereof was fixed, thereby forming a positive A-plate. The slow axis direction of the formed positive A-plate was parallel to the rubbing direction (that is, orthogonal to the absorption axis of the polarizing plate) (the reverse wavelength dispersion liquid crystal compound was aligned to be parallel with the polarizing irradiation direction). The dependence of Re on light incident angle and the tilt angle of the optical axis were measured using an automatic birefringence meter (KOBRA-21ADH, manufactured by Oji Scientific Instruments), and it was found that the reverse wavelength dispersion liquid crystal compound was homogeneously aligned with an Re of 137 nm, an Rth of 69 nm, an Re(450)/Re(550) of 0.85, an Re(650)/Re(550) of 1.05 at a wavelength of 550 nm and a tilt angle of the optical axis of 0°. The smectic-nematic phase transition temperature of the coating liquid for forming a positive A-plate was 60° C.

<Formation of Positive C-Plate>

First, the following coating liquid for forming a positive C-plate was prepared.

—Coating Liquid for Forming Positive C-Plate—

| | |
|---|---|
| Liquid crystal compound B01 | 80 parts by mass |
| Liquid crystal compound B02 | 20 parts by mass |

-continued

| | |
|---|---|
| Vertical alignment agent (S01) | 1 part by mass |
| Vertical alignment agent (S02) | 0.5 parts by mass |
| Ethylene oxide-modified trimethylol propane triacrylate (V#360, manufactured by Osaka Organic Chemical Industry Ltd.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Compound B03 | 0.4 parts by mass |
| Methyl ethyl ketone | 170 parts by mass |
| Cyclohexanone | 30 parts by mass |

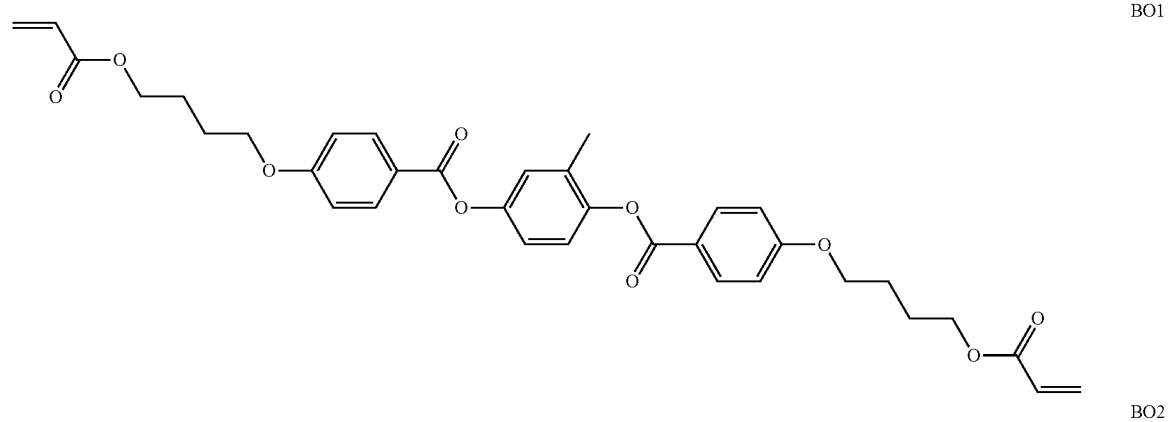

BO1

BO2

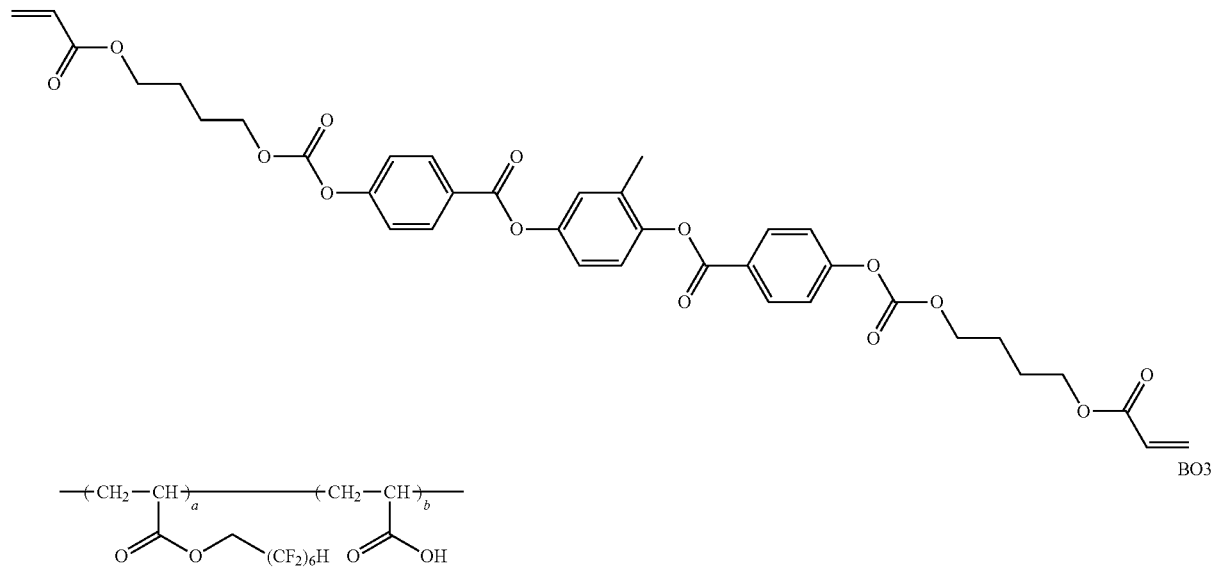

BO3

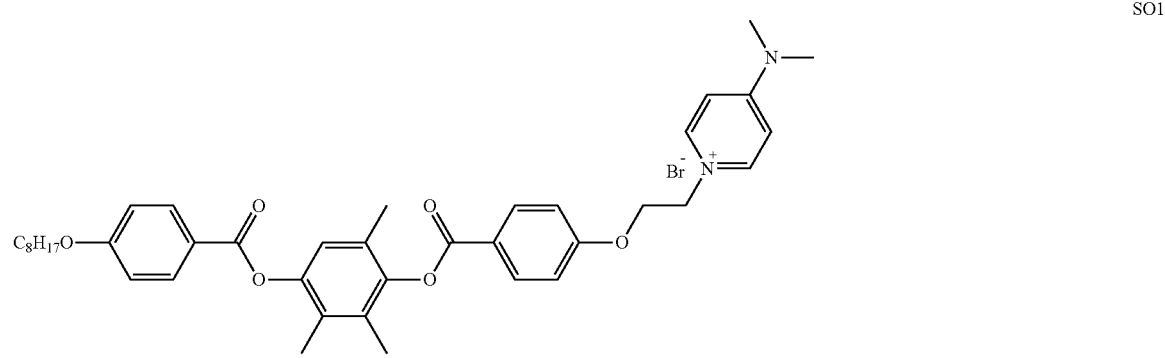

SO1

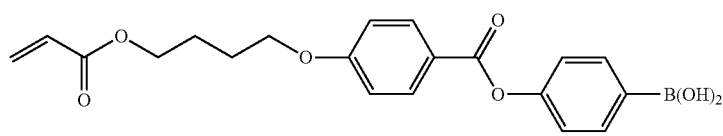

SO2

The surface of the positive A plate was rubbed in a direction orthogonal to the rubbing direction and then the coating liquid for forming a positive C-plate was directly applied thereto and heated and aged at 60° C. for 60 seconds. Then, the film was irradiated with ultraviolet rays at 1000 mJ/cm² using an air-cooled metal halide lamp (manufactured by Eye Graphics Co., Ltd.) under an atmospheric air to fix the alignment state, thereby preparing a positive C-plate. It was confirmed that the polymerizable rod-like liquid crystal compound was homeotropically aligned at a tilt angle of the optical axis of 90°. Only the retardation of the positive C-plate was measured by using AxoScan (manufactured by Axometrics, Inc.) and it was found that the Re was 0 nm, the Rth was −69 nm at a wavelength of 550 nm. In this manner, the positive A-plate and the positive C-plate were directly laminated on the film in this order to prepare an optical film of Comparative Example 1.

Stretching was not performed. The obtained liquid crystal layer exhibited a nematic phase and reverse wavelength dispersibility.

Comparative Example 2

An optical film was prepared in the same manner as in Example 1 except that the coating liquid for a smectic liquid crystal layer of Example 1 was used and a heat treatment at 100° C. was performed to form a nematic liquid crystal layer, and fixed end uniaxial stretching was performed at a stretching ratio of 50%. The liquid crystal layer obtained by stretching exhibited a nematic phase and reverse wavelength dispersibility.

Comparative Example 3

An optical film was prepared in the same manner as in the preparation of the positive A-plate of Comparative Example 1 except that the film was cooled to 55C and then irradiated with ultraviolet rays. The obtained liquid crystal layer exhibited a smectic phase and reverse wavelength dispersibility.

Next, examples of a λ/2 plate (optical compensation film) for an IPS liquid crystal display device will be described.

Example 9

An optical film was prepared in the same manner as in Example 1 except that the film thickness of the liquid crystal layer after being applied and dried was 16 μm. The liquid crystal layer obtained by stretching exhibited a smectic phase and reverse wavelength dispersibility. The film thickness after stretching was 10 μm.

Example 10

An optical film was prepared in the same manner as in Example 2 except that the film thickness of the liquid crystal layer after being applied and dried was 16 μm. The liquid crystal layer obtained by stretching exhibited a smectic phase and flat wavelength dispersibility. The film thickness after stretching was 10 μm.

Example 11

An optical film was prepared in the same manner as in Example 3 except that the film thickness of the liquid crystal layer after being applied and dried was 16 μm. The liquid crystal layer obtained by stretching exhibited a smectic phase and normal wavelength dispersibility. The film thickness after stretching was 10 μm.

Example 12

An optical film was prepared in the same manner as in Example 11 except that stretching ratio was changed to 45%. The liquid crystal layer obtained by stretching exhibited a smectic phase and normal wavelength dispersibility. The film thickness after stretching was 11 μm.

Example 13

An optical film was prepared in the same manner as in Example 10 except that stretching ratio was changed to 55%. The liquid crystal layer obtained by stretching exhibited a smectic phase and flat wavelength dispersibility. The film thickness after stretching was 10 μm.

Example 14

An optical film was prepared in the same manner as in Example 10 except that stretching ratio was changed to 40%. The liquid crystal layer obtained by stretching exhibited a smectic phase and flat wavelength dispersibility. The film thickness after stretching was 12 μm.

Example 15

An optical film was prepared in the same manner as in Example 11 except that stretching ratio was changed to 60%. The liquid crystal layer obtained by stretching exhibited a smectic phase and normal wavelength dispersibility. The film thickness after stretching was 10 μm.

Comparative Example 4

A film of Comparative Example 4 was prepared in the same manner as in Comparative Example 1 except that using the coating liquid in Comparative Example 1, the thickness of a first dried film was 2 m and the thickness of a second dried film was 3 μm. The obtained liquid crystal layer exhibited a nematic phase and reverse wavelength dispersibility.

Comparative Example 5

An optical film was prepared in the same manner as in Comparative Example 3 except that using the coating liquid for forming a positive A-plate in Comparative Example 1, the thickness of a first dried film was 2 µm. The obtained liquid crystal layer exhibited a smectic phase and reverse wavelength dispersibility.

Comparative Example 6

An optical film was obtained in the same manner as in Example 9 except that a heat treatment at 100° C. was performed to form a nematic liquid crystal layer. The obtained liquid crystal layer exhibited a nematic phase and reverse wavelength dispersibility. The film thickness after stretching was 10 µm.

[Evaluation]

<Confirmation of Liquid Crystal Layer Derived from Smectic Phase>

The X-ray diffraction of each optical film obtained by using the following device and conditions was measured. Regarding the optical films excluding Comparative Examples 1, 2, 4, and 6, it could be confirmed that the liquid crystal layer obtained by stretching was derived from a smectic phase.

An X-ray diffraction device R-AXIS with a Cu-ray source (50 kV, 300 mA) was used and the peak showing a layer structure was observed at 2θ=2.9° to 3.7°. The diffraction light caused by orderliness of the smectic phase could be confirmed.

<Measurement Method of Re(440), Re(550) and Re(630)>

Re was measured in the following method.

The optical properties of the film completed by stretching were measured using WR (manufactured by Oji Scientific Instruments). Among these, Re values at wavelengths of 440 nm, 550 nm, and 630 nm were set to Re(440), Re(550), and Re(630), respectively.

<Measurement Method of Rth(550)>

Rth was measured in the following method.

The optical properties of the film completed by stretching were measured using WR (manufactured by Oji Scientific Instruments). Among these, an Rth value at a wavelength of 550 nm was set to Rth(550).

<Calculation Method of Nz Factor>

The obtained Re(550) and Rth(550) were used to calculate an Nz factor by the following equation.

$$Nz\ factor = Rth(550)/Re(550) + 0.5$$

<Mounting into Organic EL Display Device and Evaluation of Display Performance>

The optical film of the present invention was mounted on an organic EL display device and the display performance was evaluated.

(Mounting on Organic EL Display Device)

GALAXY SII manufactured by SAMSUNG having an organic EL panel mounted therein was decomposed to peel off a circularly polarizing plate, and the films of Examples and Comparative Examples were bonded to the peeled surface. Further, polarizing plates were bonded to the visible side such that the absorption axis of each polarizing plate was tilted at an angle of 45° with respect to the slow axis of the films of Examples and Comparative Examples to prepare display devices. For the bonding, an optically isotropic adhesive (SK2057, manufactured by Soken Chemical & Engineering Co., Ltd.) was used.

(Evaluation of Display Performance)

The visibility under bright light and the display quality of the prepared organic EL display devices were evaluated.

The display devices were allowed to perform white display, black display, and image display, and reflected light was observed in a case where fluorescent light and the like were applied at a front surface and a polar angle of 60°. The display qualities at the front surface and the polar angle of 60° were evaluated in accordance with the following standards. The evaluation results are shown in Table 1.

(Evaluation Standards)

A: Tint is not visually recognized at all.

B: The tint difference is visually recognized but is negligible.

C: The tint difference is visually recognized, but the amount of reflected light is small, which is not a problem for use.

D: The tint difference is visually recognized and the amount of reflected light is large, which is thus unacceptable.

<Mounting into IPS Liquid Crystal Display Device and Evaluation of Display Performance>

Polarizing plates were removed from the visible side of the liquid crystal cell of iPad (registered trademark, using a photo-alignment film, manufactured by Apple, Inc.), and used as a liquid crystal cell in an IPS using the photo-alignment film. In addition, the pre-tilt angle of the liquid crystal of the liquid crystal cell was 0°.

The liquid crystal display devices were prepared by bonding the polarizing plate including the optical film prepared in each of Examples to the liquid crystal cell instead of the peeled polarizing plate. Further, in Comparative Examples, the polarizing plate including the optical film prepared was bonded to the liquid crystal cell through the surface of the positive A-plate. At this time, when observed from a direction orthogonal to the surface of the substrate of the liquid crystal cell, the bonding was performed in the direction such that the absorption axis of the polarizing plate was orthogonal to the optical axis of the liquid crystal layer in the liquid crystal cell. For the bonding, an adhesive (SK2057, manufactured by Soken Chemical & Engineering Co., Ltd.) was used.

<Front Surface Contrast>

A black display and a white display were performed on the liquid crystal display device and the transmittances in the front direction (in a direction normal to the display surface) were respectively measured using a measurement machine (EZ-Contrast 160D, manufactured by ELDIM). The front surface contrast ratio CR (transmittance of white display/transmittance of black display) was calculated. The contrast ratio was evaluated based on the following evaluation results.

(Evaluation Standards)

A: 900≤CR

B: 850≤CR<900

C: 800≤CR<850

D: 800>CR

<Change in Oblique Tint>

The tint coordinates u'v' are measured using a measurement machine (EZ-Contrast 160D, manufactured by ELDIM). The measurement angle was fixed in a direction of a polar angle of 50° and the azimuthal angle was rotated by 360 degrees in steps of 15 degrees to measure the tint coordinates u'v'. A change in tint Δu'v'(50°) was calculated by taking a difference between the maximum value and the minimum value. The value was used as an evaluation index and evaluated based on the following evaluation standards.

(Evaluation Standards)

A: A change in oblique tint was improved by 40% or more with respect to that of the liquid crystal display device using Comparative Example 4.

B: A change in oblique tint was improved by 25% to less than 40% with respect to that of the liquid crystal display device using Comparative Example 4.

C: A change in oblique tint was improved by 10% to less than 25% with respect to that of the liquid crystal display device using Comparative Example 4.

D: A change in oblique tint was equal to or less than that of the liquid crystal display device using Comparative Example 4.

The evaluation results from Examples 1 to 8 and Comparative Examples 1 to 3 are shown in Table 1. In Table 1, Sm of the liquid crystal layer represents a smectic phase and Ne represents a nematic phase.

TABLE 1

| | | | | Example 1 | Example 2 | Example 3 | Example 4 | Example 5 | Example 6 |
|---|---|---|---|---|---|---|---|---|---|
| Liquid crystal phase | | | | Sm | Sm | Sm | Sm | Sm | Sm |
| Stretching ratio | | | [%] | 50 | 50 | 50 | 45 | 55 | 40 |
| Liquid crystal layer film thickness | First layer | | [μm] | 5 | 5 | 5 | 5.5 | 5 | 6 |
| | Second layer | | [μm] | — | — | — | — | — | — |
| Optical properties | First layer | Re(550) | [nm] | 138 | 138 | 138 | 138 | 138 | 138 |
| | | Rth(550) | [nm] | 0 | 0 | 0 | −14 | 13 | −29 |
| | | Nz | | 0.5 | 0.5 | 0.5 | 0.4 | 0.6 | 0.3 |
| | | Re(440)/Re(550) | | 0.85 | 1.00 | 1.20 | 1.00 | 1.00 | 0.85 |
| | | Re(630)/Re(550) | | 1.05 | 1.00 | 0.90 | 1.00 | 1.00 | 1.05 |
| | Second layer | Re(550) | [nm] | — | — | — | — | — | — |
| | | Rth(550) | [nm] | — | — | — | — | — | — |
| | | Nz | | — | — | — | — | — | — |
| | | Re(440)/Re(550) | | — | — | — | — | — | — |
| | | Re(630)/Re(550) | | — | — | — | — | — | — |
| | Total | Re(550) | [nm] | 138 | 138 | 138 | 138 | 138 | 138 |
| | | Rth(550) | [nm] | 0 | 0 | 0 | −14 | 13 | −29 |
| | | Nz | | 0.5 | 0.5 | 0.5 | 0.4 | 0.6 | 0.3 |
| | | Re(440)/Re(550) | | 0.85 | 1.00 | 1.20 | 1.00 | 1.00 | 0.85 |
| | | Re(630)/Re(550) | | 1.05 | 1.00 | 0.90 | 1.00 | 1.00 | 1.05 |
| OLED display performance | Front surface | | | A | B | C | B | B | A |
| | Polar angle 60° | | | A | B | C | B | B | B |

| | | | | Example 7 | Example 8 | Comparative Example 1 | Comparative Example 2 | Comparative Example 3 |
|---|---|---|---|---|---|---|---|---|
| Liquid crystal phase | | | | Sm | Sm | Ne | Ne | Sm |
| Stretching ratio | | | [%] | 60 | 65 | — | 50 | — |
| Liquid crystal layer film thickness | First layer | | [μm] | 5 | 5 | 1 | 5 | 1 |
| | Second layer | | [μm] | — | — | 1.5 | — | — |
| Optical properties | First layer | Re(550) | [nm] | 138 | 138 | 138 | 138 | 138 |
| | | Rth(550) | [nm] | 30 | 40 | 69 | 0 | 69 |
| | | Nz | | 0.7 | 0.8 | 1.0 | 0.5 | 1.0 |
| | | Re(440)/Re(550) | | 1.00 | 0.85 | 0.85 | 0.85 | 0.85 |
| | | Re(630)/Re(550) | | 1.00 | 1.05 | 1.05 | 1.05 | 1.05 |
| | Second layer | Re(550) | [nm] | — | — | 0 | — | — |
| | | Rth(550) | [nm] | — | — | −69 | — | — |
| | | Nz | | — | — | −∞ | — | — |

TABLE 1-continued

|  |  |  |  |  |  |  |  |  |
|---|---|---|---|---|---|---|---|---|
|  |  | Re(440)/Re(550) |  | — | — | — | — | — |
|  |  | Re(630)/Re(550) |  | — | — | — | — | — |
|  | Total | Re(550) | [nm] | 138 | 138 | 138 | 138 | 138 |
|  |  | Rth(550) | [nm] | 30 | 40 | 0 | 0 | 69 |
|  |  | Nz |  | 0.7 | 0.8 | 0.5 | 0.5 | 1.0 |
|  |  | Re(440)/Re(550) |  | 1.00 | 0.85 | 0.85 | 0.85 | 0.85 |
|  |  | Re(630)/Re(550) |  | 1.00 | 1.05 | 1.05 | 1.05 | 1.05 |
| OLED display performance | Front surface |  |  | B | A | D | D | B |
|  | Polar angle 60° |  |  | C | C | C | B | D |

The evaluation results from Examples 9 to 15 and Comparative Examples 4 to 6 are shown in Table 2.

TABLE 2

|  |  |  |  | Example 9 | Example 10 | Example 11 | Example 12 | Example 13 | Example 14 | Example 15 | Comparative Example 4 | Comparative Example 5 | Comparative Example 6 |
|---|---|---|---|---|---|---|---|---|---|---|---|---|---|
| Liquid crystal phase |  |  |  | Sm | Sm | Sm | Sm | Sm | Sm | Sm | Ne | Sm | Ne |
| Stretching ratio |  |  | [%] | 50 | 50 | 50 | 45 | 55 | 40 | 60 | — | — | 50 |
| Liquid crystal layer film thickness | First layer |  | [μm] | 10 | 10 | 10 | 11 | 10 | 12 | 10 | 2 | 2 | 10 |
|  | Second layer |  | [μm] | — | — | — | — | — | — | — | 3 | — | — |
| Optical properties | First layer | Re(550) | [nm] | 275 | 275 | 275 | 275 | 275 | 275 | 275 | 275 | 275 | 275 |
|  |  | Rth(550) | [nm] | 0 | 0 | 0 | −30 | 50 | −80 | 70 | 138 | 138 | 0 |
|  |  | Nz |  | 0.5 | 0.5 | 0.5 | 0.4 | 0.7 | 0.2 | 0.8 | 1.0 | 1.0 | 0.5 |
|  |  | Re(440)/Re(550) |  | 0.85 | 1.00 | 1.20 | 1.20 | 1.00 | 1.00 | 1.20 | 1.00 | 1.00 | 0.85 |
|  |  | Re(630)/Re(550) |  | 1.05 | 1.00 | 0.90 | 0.90 | 1.00 | 1.00 | 0.90 | 1.00 | 1.00 | 1.05 |
|  | Second layer | Re(550) | [nm] | — | — | — | — | — | — | — | 0 | — | — |
|  |  | Rth(550) | [nm] | — | — | — | — | — | — | — | −138 | — | — |
|  |  | Nz |  | — | — | — | — | — | — | — | −∞ | — | — |
|  |  | Re(440)/Re(550) |  | — | — | — | — | — | — | — | — | — | — |
|  |  | Re(630)/Re(550) |  | — | — | — | — | — | — | — | — | — | — |
|  | Total | Re(550) | [nm] | 275 | 275 | 275 | 275 | 275 | 275 | 275 | 275 | 275 | 275 |
|  |  | Rth(550) | [nm] | 0 | 0 | 0 | 0 | 0 | 0 | 0 | 0 | 138 | 0 |
|  |  | Nz |  | 0.5 | 0.5 | 0.5 | 0.4 | 0.7 | 0.2 | 0.8 | 0.5 | 1.0 | 0.5 |
|  |  | Re(440)/Re(550) |  | 0.85 | 1.00 | 1.20 | 1.20 | 1.00 | 1.00 | 1.00 | 1.00 | 1.00 | 0.85 |
|  |  | Re(630)/Re(550) |  | 1.05 | 1.00 | 0.90 | 0.90 | 1.00 | 1.00 | 1.00 | 1.00 | 1.00 | 1.05 |
| IPS mounting result | Front surface contrast |  |  | A | A | A | B | B | B | B | D | B | D |
|  | Oblique tint |  |  | A | A | B | B | B | C | C | D | D | B |

In a case where the optical film of the present invention was used as a λ/4 plate (antireflection film) of an organic EL display device, as shown in Table. 1, the display performance in the front and at a polar angle of 60° was good. Particularly, in Examples 1 and 6 in which the reverse wavelength dispersibility liquid crystal layers were obtained, the display performance (denoted as OLED display performance in Table 1) was good.

On the other hand, in Comparative Example 1, the optical film had a two-layer structure, constituted a λ/4 plate, and the Nz factor was 0.5 as an ideal value. However, the display performance at a polar angle of 60° was rated as C and deteriorated. By adopting the two-layer structure, circular polarization is lowered by the effect of Rth of each layer, which is considered as a main reason. In Comparative Example 2, the Nz factor was 0.5 as an ideal value, but the front surface display performance was rated as D and deteriorated. This is because, since a fluctuation is made in the alignment of the liquid crystal molecules due to the nematic phase, light leakage occurs. In Comparative Example 3, the display performance at a polar angle of 60° was rated as D and deteriorated. This is because, an Nz factor of 1.0 is too high, and light leakage occurs although the liquid crystal layer exhibits a smectic phase.

In addition, in a case in which the optical film of the present invention was used as a λ/2 plate (optical compensation film) of an IPS liquid crystal display device, as shown in Table 2, the display performance of the front surface contrast and a change in oblique tint (denoted as IPS display performance in Table 2) was good.

On the other hand, in Comparative Examples 4, the film had a two-layer structure and constituted a λ/2 plate, and both the front surface contrast and oblique tint were rated as D and deteriorated. This is because, since the optical compensation film has two-layer structure and exhibits a nematic phase, linear polarization is not satisfactorily performed and light leakage occurs. In Comparative Examples 5, the film exhibits a smectic phase but a change in oblique tint was rated as D and deteriorated. This is because the Nz factor is 1.0 and is too large and light leakage occurs. In Comparative Examples 6, the Nz factor was 0.5 as an ideal value, but the front surface contrast was rated as D and deteriorated. This is because due to the nematic phase, fluctuation is made in the alignment of the liquid crystal molecules.

As described above, it was found that since the optical film of the present invention has a liquid crystal layer derived from a smectic phase, and the Nz factor of the liquid crystal layer is from 0.2 to 0.8, in a case where a single layer of liquid crystal layer of a single layer is used in a display device as a λ/4 plate or a λ/2 plate, good display performance can be obtained. In all of Examples, since a support not having optical effect on the liquid crystal layer is used, the optical performance of the optical film is the same as the optical performance of the liquid crystal layer.

In the present invention, a support having optical effect on the liquid crystal layer may be used, but in this case, desired performance can be achieved by peeling off the liquid crystal layer from the support after fixed end uniaxial stretching and transferring the phase to another support or the like.

EXPLANATION OF REFERENCES

- 10: optical film
- 11: support
- 12: alignment layer
- 13: liquid crystal layer
- 21: film before stretching
- 22: tenter
- 23: film after stretching
- 30: organic EL display device
- 31: organic EL panel
- 32: λ/4 plate (antireflection film)
- 33: rear surface electrode
- 34: transparent electrode
- 35: light emitting layer
- 36: polarizer
- 40: IPS liquid crystal display device
- 41, 42: polarizing plate
- 43: liquid crystal cell
- 44, 45: glass substrate
- 46a, 46b: liquid crystal molecule
- 47: transparent anode
- 48: transparent cathode

What is claimed is:

1. An optical film comprising a liquid crystal layer derived from a smectic phase,
   wherein an Nz factor of the liquid crystal layer is from 0.2 to 0.7, and
   wherein a retardation value Re(440) of the liquid crystal layer as measured at a wavelength of 440 nm, a retardation value Re(550) of the liquid crystal layer as measured at a wavelength of 550 nm, and a retardation value Re(630) of the liquid crystal layer as measured at a wavelength of 630 nm satisfy the following relationships:

$Re(440) < Re(550) \times 0.9$ $Re(630) > Re(550)$.

2. The optical film according to claim 1, wherein an Nz factor of the liquid crystal layer is from 0.4 to 0.7.

3. The optical film according to claim 1, wherein the liquid crystal layer includes a reverse wavelength dispersion liquid crystal compound.

4. The optical film according to claim 3, wherein the liquid crystal layer further includes a normal wavelength dispersion liquid crystal compound.

5. The optical film according to claim 1, wherein the optical film has a thickness of 5 μm to 60 μm.

6. The optical film according to claim 1, wherein the liquid crystal layer has a thickness of 2 μm to 30 μm.

7. The optical film according to claim 1, wherein the liquid crystal layer includes a vertical alignment agent.

8. The optical film according to claim 1 that is a λ/4 plate for an organic EL display device.

9. The optical film according to claim 1 that is a λ/2 plate for an IPS liquid crystal display device.

10. A display device comprising the optical film according to claim 1.

11. An optical film comprising a liquid crystal layer derived from a smectic phase,
    wherein an Nz factor of the liquid crystal layer is from 0.2 to 0.7
    wherein the optical film is a λ/4 plate, and a retardation value Re(550) of the liquid crystal layer as measured at a wavelength of 550 nm satisfies the following relationship:

$120 \text{ nm} \leq Re(550) \leq 150 \text{ nm}$.

12. An optical film comprising a liquid crystal layer derived from a smectic phase,
    wherein an Nz factor of the liquid crystal layer is from 0.2 to 0.7
    wherein the optical film is a λ/2 plate, and a retardation value Re(550) of the liquid crystal layer as measured at a wavelength of 550 nm satisfies the following relationship:

$200 \text{ nm} \leq Re(550) \leq 320 \text{ nm}$.

* * * * *